(12) United States Patent
Morita

(10) Patent No.: US 10,429,424 B2
(45) Date of Patent: Oct. 1, 2019

(54) WIRELESS TERMINAL MEASUREMENT APPARATUS

(71) Applicant: ANRITSU CORPORATION, Kanagawa (JP)

(72) Inventor: Tomonori Morita, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 16/251,650

(22) Filed: Jan. 18, 2019

(65) Prior Publication Data
US 2019/0242935 A1 Aug. 8, 2019

(30) Foreign Application Priority Data

Feb. 5, 2018 (JP) ................. 2018-018146

(51) Int. Cl.
| | |
|---|---|
| *H04B 17/00* | (2015.01) |
| *H04W 24/00* | (2009.01) |
| *H04M 3/22* | (2006.01) |
| *G01R 29/10* | (2006.01) |
| *H04B 17/29* | (2015.01) |
| *H04B 17/16* | (2015.01) |
| *H01Q 3/26* | (2006.01) |

(52) U.S. Cl.
CPC ............... *G01R 29/10* (2013.01); *H01Q 3/26* (2013.01); *H04B 17/16* (2015.01); *H04B 17/29* (2015.01)

(58) Field of Classification Search
CPC ...... H04B 17/29; H04B 17/16; H04B 17/103; H04B 17/0085; H04W 24/06; H04M 1/24; H04M 3/22; H04M 3/26; H01Q 3/26; H01Q 3/267; G01R 29/10
See application file for complete search history.

(56) References Cited

U.S. PATENT DOCUMENTS

| | | | | |
|---|---|---|---|---|
| 2004/0183547 A1* | 9/2004 | Kildal | ................ | G01R 29/0821 324/627 |
| 2011/0043418 A1* | 2/2011 | Teshirogi | ........... | G01R 29/0821 343/703 |
| 2012/0286122 A1* | 11/2012 | Tankielun | .......... | G01R 29/0864 248/346.06 |
| 2016/0187876 A1* | 6/2016 | Diperna | ................. | H04B 17/11 702/81 |
| 2018/0172747 A1* | 6/2018 | Qi | ......................... | G01R 29/08 |

(Continued)

FOREIGN PATENT DOCUMENTS

JP        2009-031209 A       2/2009

*Primary Examiner* — Andrew Wendell
(74) *Attorney, Agent, or Firm* — Pearne & Gordon LLP

(57) ABSTRACT

A distance H from a standard point O to one surface of a bottom plate of a terminal holding section 31 is set so that with respect to a direct wave that is output from one of a measurement antenna 25 and a wireless terminal that is a measurement target and is directly input to the other one thereof, a reflectivity of a reflection wave that is output from the one thereof, is reflected on one surface 32a of the bottom plate of the terminal holding section 31, and is input to the other one thereof is equal to or smaller than an incidence angle (for example, 80° or 70°) for assigning a predetermined allowable limit in view of a characteristic of incidence angle-to-reflectivity determined by a specific dielectric constant of the terminal holding section 31, to thereby reduce an influence of the reflection wave on measurement.

12 Claims, 18 Drawing Sheets

(56) References Cited

U.S. PATENT DOCUMENTS

2019/0068296 A1* 2/2019 Rowell ................ H04B 17/101
2019/0113540 A1* 4/2019 Towfiq .................... G01R 1/18
2019/0124529 A1* 4/2019 Garcia ................. H04W 24/06

* cited by examiner

WIRELESS TERMINAL MEASUREMENT APPARATUS

TECHNICAL FIELD

The present invention relates to a wireless terminal measurement apparatus used in measuring transmission/reception characteristics of a wireless terminal such as a mobile phone, a smartphone, a tablet, or a wireless router, and particularly, to a technique for accurately measuring characteristics of a wireless terminal that uses a millimeter-wave band such as 24.25 GHz, 28 GHz, or 39 GHz allocated to the next generation (fifth generation) wireless terminal.

BACKGROUND ART

As a method for measuring transmission/reception characteristics of a wireless terminal using an actual radio wave, a method for disposing a wireless terminal that is a measurement target and a measurement antenna in a radio wave anechoic chamber or a radio wave anechoic box and performing transmission and reception of radio waves between the wireless terminal and the measurement antenna while relatively changing a posture of the wireless terminal with respect to the measurement antenna to obtain measurement values necessary for evaluation in all directions, that is, a so-called over the air (OTA) environment test has been used in the related art.

In the measurement under the OTA environment, a method for rotating a wireless terminal disposed on an intersection point between a first axis (for example, a Z axis) and a second axis (for example, an X axis) orthogonal to the first axis around the first axis and revolving a measurement antenna in a plane (X-Z plane) including the first axis and the second axis or a plane (Y-Z plane) including the first axis and a third axis (Y axis) around the wireless terminal with a predetermined radius, and a method for disposing a wireless terminal at an intersection position between the first axis and the second axis, fixing a measurement antenna at a position on the second axis that is spaced away from the intersection position by a predetermined distance, and rotating the wireless terminal in a plane (X-Y plane) orthogonal to the first axis and in a plane including the first axis around the intersection point between the first axis and the second axis have been used. However, since the former method has a disadvantage in that a movable range of the measurement antenna becomes wide and a measurement system becomes large in size, generally, the latter method has been widely used.

In order to realize the latter method, a terminal holding rotation mechanism for rotating a wireless terminal held at an intersection position between two orthogonal axes (Z axis and X axis) around the intersection position to change a posture of the wireless terminal with respect to the measurement antenna, in a radio wave anechoic chamber or a radio wave anechoic box, is necessary.

The terminal holding rotation mechanism needs to have a terminal holding section that holds the wireless terminal and a rotation mechanism that rotates the terminal holding section around a vertical axis and a horizontal axis, as a basic structure.

As a specific configuration example, there is a general structure in which a vertical rotation mechanism that rotates a table around a vertical axis (Z axis) using a drive device such as a motor and a horizontal rotation mechanism disposed on the table are provided.

Further, in consideration of materials of component members, it is necessary that the terminal holding section and the rotation mechanism are configured to reduce an influence on radio waves transmitted and received between the wireless terminal and the measurement antenna as much as possible. Further, it is necessary that a metallic material of the motor that is a drive source of the rotation mechanism, or the like is coated with a radio wave absorbent at a position that is sufficiently spaced away from the terminal holding section.

Further, in the terminal holding section considered to have the greatest influence on the measurement and its peripheral section, it is necessary to use a material with a low specific dielectric constant that easily transmits and does not easily reflects radio waves, for example, a material formed of foam, synthetic resin, rubber, or the like.

In this way, a configuration example of the terminal holding rotation mechanism necessary for performing measurement of the wireless terminal is disclosed in Patent Document 1, for example.

The technique disclosed in Patent document 1 has, in consideration of measurement of a terminal that uses a 800 MHz band or a 2 GHz band, a structure in which opposite ends of a terminal holding section (arm) that directly supports a wireless terminal are supported to be rotatable around a horizontal axis through pulleys on upper ends of two poles standing up on a turntable that rotates around a vertical axis and the turntable and the terminal holding section are driven to rotate to change a posture of the wireless terminal, and reduces an influence on measurement, of the wireless terminal that uses the 800 MHz band or the 2 GHz band, by regulating lengths of the poles and a specific dielectric constant, or a pulley interval and the specific dielectric constant, for example.

RELATED ART DOCUMENT

Patent Document

[Patent Document 1] JP-A-2009-31209

DISCLOSURE OF THE INVENTION

Problem that the Invention is to Solve

However, with respect to the wireless terminal that is the measurement target, it is also necessary to consider a large terminal such as a tablet as well as a small terminal such as a mobile phone or a smartphone. In addition, as a position where a wireless terminal is held, it is preferable that an antenna inside a housing of the terminal (hereinafter, referred to as a terminal antenna) is disposed at an intersection position (a rotational center of a measurement system) of two rotational axes. In many cases, the position of the terminal antenna is generally provided in a peripheral portion inside the housing, in consideration of its usage form.

Accordingly, in order to reliably support the entirety of the wireless terminal in a state where the peripheral portion in which the terminal antenna is provided is at the rotational center of the measurement system, it is necessary to provide a bottom plate having a wide area where rear surfaces of various wireless terminals having different sizes are supported at a position of a distance in consideration of the thickness of the terminal from the rotational center of the measurement system.

However, as described above, in a case where the area of the bottom plate of the terminal holding section is widened, a reflection wave generated on a surface of the bottom plate (a surface that faces the terminal) greatly gives an influence on measurement. The reflection wave has a characteristic that the reflectivity becomes larger as an incidence angle (that is equal to a reflection angle) of a radio wave with respect to the surface of the bottom plate of the terminal holding section is closer to 90° (as an angle formed by the surface of the bottom plate and an incidence path of the radio wave is closer to 0°), and thus, the influence noticeably appears.

The influence of the reflection wave is due to the fact that straightness of an electromagnetic wave is high in a millimeter-wave band in which a radio wave used in the fifth generation is about 30 GHz or greater. Due to a large change of the influence of the reflection wave depending on rotation of the terminal holding section, it is difficult to perform accurate measurement with respect to a wireless terminal that uses a millimeter-wave band.

In order to solve the above-mentioned problems, an object of the invention is to provide a wireless terminal measurement apparatus capable of reducing an influence of reflection of a bottom plate of a terminal holding section to accurately measure characteristics of a wireless terminal that uses a millimeter-wave band.

Means for Solving the Problem

In order to achieve the above object, according to a first aspect of the invention, there is provided a wireless terminal measurement apparatus including: a measurement antenna which is fixed at a predetermined position in a measurement space in which entrance of a radio wave from the outside and internal reflection of the radio wave are suppressed; and a terminal holding rotation mechanism that includes a terminal holding section that holds, using a position that is spaced away from the measurement antenna by a predetermined distance as a standard point in the measurement space, a wireless terminal that is a measurement target on one surface side of a bottom plate of a predetermined area in a state where a terminal antenna of the wireless terminal is positioned at the standard point, and a rotation mechanism that rotates the terminal holding section around the standard point, in which a characteristic of the wireless terminal is obtained by performing transmission and reception of a radio wave between the measurement antenna and the wireless terminal while changing a posture of the wireless terminal with respect to the measurement antenna, and a distance from the standard point to the one surface of the bottom plate of the terminal holding section is set so that a reflectivity of a reflection wave that is output from one of the measurement antenna and the wireless terminal, is reflected from the one surface of the bottom plate of the terminal holding section, and is input to the other one thereof is equal to or smaller than a value of a predetermined allowable limit.

According to a second aspect of the invention, in the wireless terminal measurement apparatus of the first aspect, the value of the predetermined allowable limit of the reflectivity may be given to be equal to or smaller than a predetermined incidence angle in view of a characteristic of incidence angle-to-reflectivity determined by a specific dielectric constant of the terminal holding section.

According to a third aspect of the invention, in the wireless terminal measurement apparatus of the second aspect, the terminal holding section may be formed of a foaming material of a specific dielectric constant of 1.03, and may have an incidence angle for assigning the allowable limit of 80°.

According to a fourth aspect of the invention, in the wireless terminal measurement apparatus of the second aspect, the terminal holding section may be formed of a foaming material of a specific dielectric constant of 1.03, and may have an incidence angle for assigning the allowable limit of 70°.

According to a fifth aspect of the invention, in the wireless terminal measurement apparatus of the first aspect, the terminal holding section may be provided with a support portion that stands up on the bottom plate.

According to a sixth aspect of the invention, in the wireless terminal measurement apparatus of the fifth aspect, the support portion may be formed with a plurality of plates in a grid form and may support a housing of the wireless terminal on upper edges of the plurality of plates, and the terminal holding section may be further provided with a terminal presser that is formed to be engaged with an unspecified position of the upper edges of the plurality of plates that form the support portion and fixes a position of the housing of the wireless terminal supported on the upper edges of the plurality of plates of the support portion.

Advantage of the Invention

As described above, in the wireless terminal measurement apparatus of the first and second aspects, since a distance from a standard point to one surface of a bottom plate of a terminal holding section is set so that with respect to a direct wave that is output from one of a measurement antenna and a wireless terminal that is a measurement target and is directly input to the other one thereof, a reflectivity of a reflection wave that is output from the one thereof, is reflected on one surface of the bottom plate of the terminal holding section, and is input to the other one thereof is equal to or smaller than an incidence angle for assigning a predetermined allowable limit in view of a characteristic of incidence angle-to-reflectivity determined by a specific dielectric constant of the terminal holding section, it is possible to reduce an influence of the reflection wave on measurement, and to accurately perform measurement with respect to the wireless terminal.

Further, according to the third aspect, in a case where the terminal holding section is formed of a foaming material of a specific dielectric constant of 1.03, and the incidence angle for assigning the allowable limit is 80°, it is possible to set a reflectivity of a reflection wave to 0.4 or smaller, and to reduce an influence of the reflection wave. In addition, according to the fourth aspect, in a case where the terminal holding section is formed of a foaming material of a specific dielectric constant of 1.03, and the incidence angle for assigning the allowable limit is 70°, it is possible to set a reflectivity of a reflection wave to 0.1 or smaller, and to reduce an influence of the reflection wave.

Further, according to the fifth and sixth aspects, since the terminal holding section is provided with a support portion that stands up on the bottom plate, the support portion is formed with a plurality of plates in a grid form and supports a housing of the wireless terminal on upper edges of the plurality of plates, and the terminal holding section is further provided with a terminal presser that is formed to be engaged with an unspecified position of the upper edges of the plurality of plates that form the support portion and fixes a position of the housing of the wireless terminal supported on the upper edges of the plurality of plates of the support portion, by associating the height of the support portion with a distance from the standard point where the reflectivity is equal to or smaller than the incidence angle for assigning an allowable limit to the bottom plate, it is possible to perform measurement in a state where an influence due to reflection on the bottom plate is small, and in a state where wireless terminals of measurement targets having different sizes are fixed at desired positions.

BEST MODE FOR CARRYING OUT THE INVENTION

Hereinafter, embodiments of the invention will be described with reference to the accompanying drawings.

Figure 1:
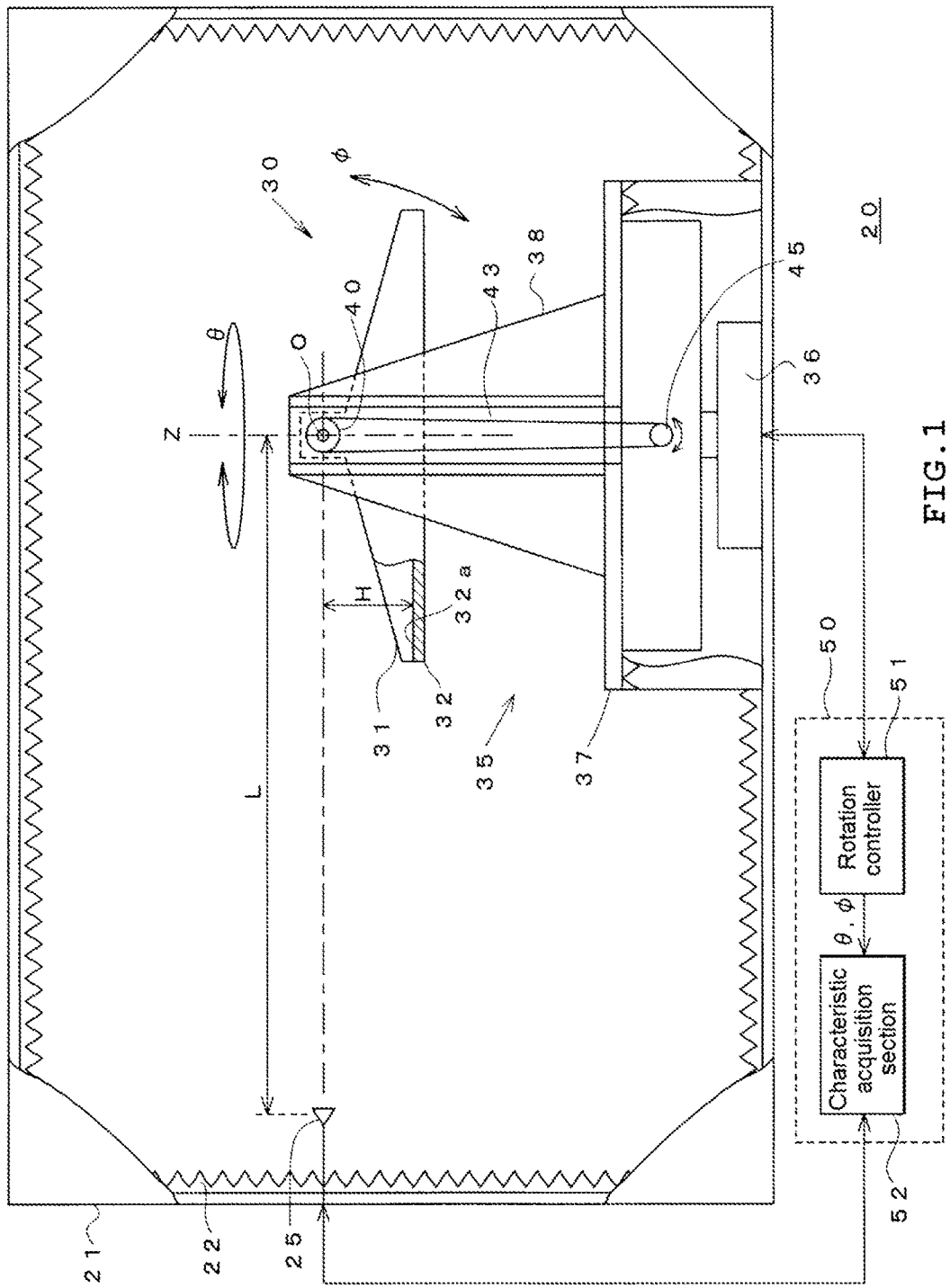
FIG. 1 is an overall configuration diagram of an embodiment of the invention.
Figure 2:
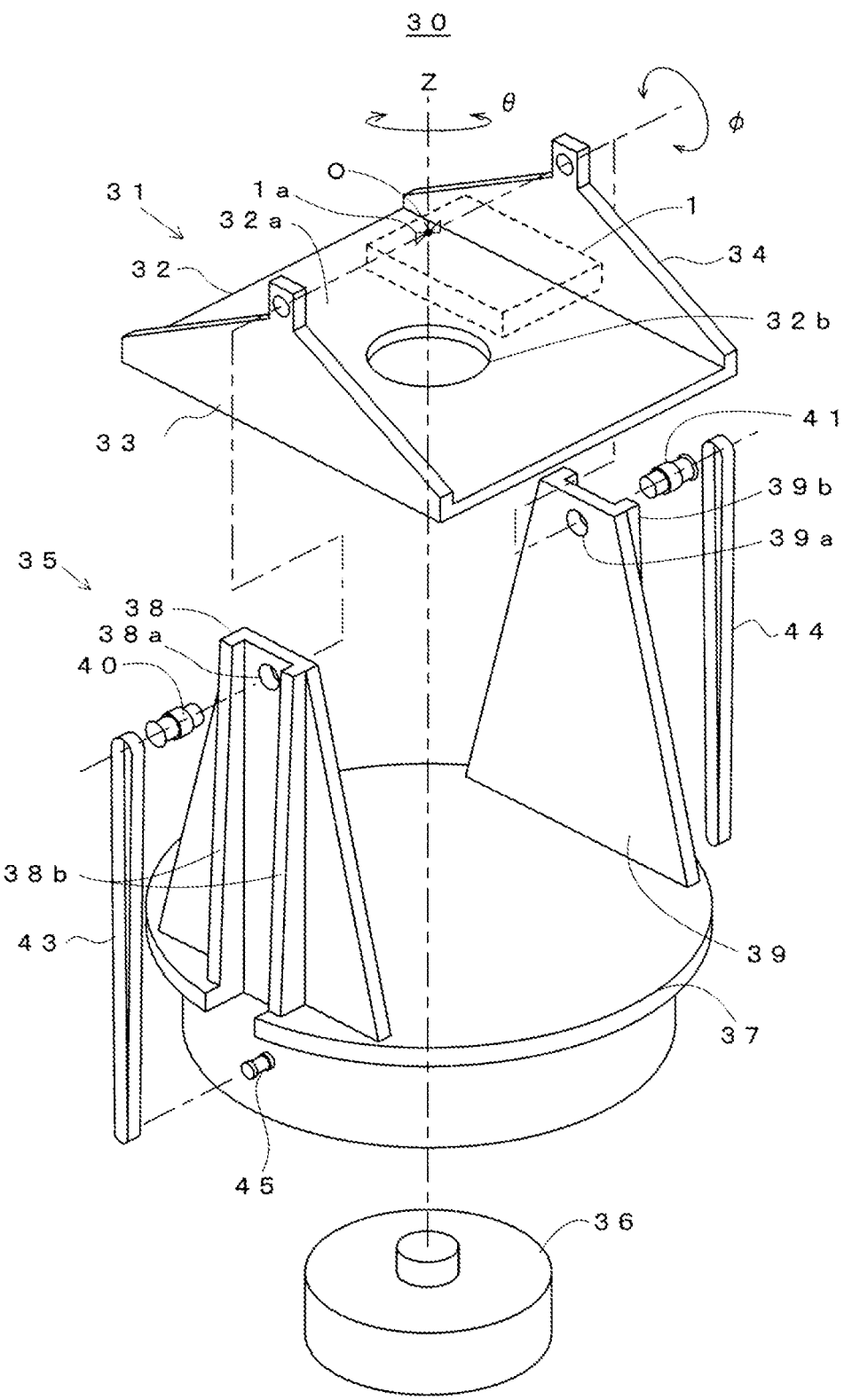
FIG. 2 is an exploded perspective view of a mechanism unit of an embodiment of the invention.

FIG. 1 shows an overall configuration of a wireless terminal measurement apparatus 20 to which the invention is applied, and FIG. 2 shows an exploded perspective view of a terminal holding rotation mechanism that is a main section thereof.

As shown in FIG. 1, the wireless terminal measurement apparatus 20 includes a radio wave anechoic box 21, a measurement antenna 25 provided in the radio wave anechoic box 21, a terminal holding rotation mechanism 30, and a measurement unit 50.

The radio wave anechoic box 21 provides a measurement space in which entrance of a radio wave from the outside and internal reflection of the radio wave are suppressed. Here, since an outer housing of the radio wave anechoic box 21 is made of a metallic material, entrance of an electromagnetic wave from the outside and leakage of the electromagnetic wave from the inside are suppressed. Further, since an entire internal wall of the radio wave anechoic box 21 is coated with a radio wave absorbent 22, so that internal reflection of the electromagnetic wave is suppressed.

The measurement antenna 25 is a known antenna having characteristics for transmitting and receiving a radio wave of a millimeter-wave band (24.25 GHz, 28 GHz, 39 GHz, or the like) used in the fifth generation. In a millimeter-wave band, various antennas such as a horn antenna or an antenna (for example, a tapered slot antenna) in which an antenna element is patterned on a printed board may be used. The measurement antenna 25 is fixed in the vicinity of a wall surface spaced away from a standard point O inside the radio wave anechoic box 21 by a predetermined distance L. The distance L is set to be sufficiently long (for example, 600 mm) with respect to a wavelength (about 10 mm) in the millimeter-wave band, and is set to be in a distance range where far field measurement is possible and a propagation loss is small.

The terminal holding rotation mechanism 30 includes a terminal holding section 31 that holds a wireless terminal 1 that is a measurement target (hereinafter, simply, referred to as the wireless terminal 1) in a state where a terminal antenna 1a of the wireless terminal 1 is positioned at a standard point O, and a rotation mechanism 35 that rotates the wireless terminal 1 held by the terminal holding section 31 around the standard point O.

The terminal holding section 31 includes a rectangular bottom plate 32 having a thickness (for example, an outer size of 400×400 mm and a thickness of 10 mm) capable of securing a width and a strength capable of sufficiently handling a difference between outer sizes of the wireless terminals 1, a difference between positions of terminal antennas, or the like. As shown in FIG. 2, the terminal holding section 31 is configured so that mountain-shaped side plates 33 and 34 stand up to face each other on opposite sides of the bottom plate 32 and upper central sections of the side plates 33 and 34 are supported by the rotation mechanism 35. The wireless terminal 1 is supported on one surface (an upper surface in the figure) 32a of the bottom plate 32 (hereinafter, a surface on which the wireless terminal 1 of the bottom plate 32 is supported is referred to as a terminal facing surface). Further, at the center of the bottom plate 32, a hole 32b through which a radio wave from a surface side opposite to the terminal facing surface 32a is incident to the wireless terminal 1 is formed.

The rotation mechanism 35 includes a base 37 that rotates around a vertical axis (hereinafter, a Z axis) that passes through the standard point O using a motor 36 as a drive source, support arms 38 and 39 that stand up in parallel to face each other on opposite sides on an upper surface of the base 37, pulleys 40 and 41 that are provided to be rotatable on the same axis in a state where the pulleys 40 and 41 horizontally pass through upper portions of the support arms 38 and 39, and endless belts 43 and 44 of which one end sides are hung up on outer sides the pulleys 40 and 41.

Further, lower end sides of the belts 43 and 44 are connected to a shaft 45 that protrudes on a lower side of the base 37, in which as the shaft 45 is rotated by driving of a motor (not shown) inside the base 37, the pulleys 40 and 41 are rotated in the same direction.

The pulleys 40 and 41 have a coaxial structure in which an outer housing supports a shaft portion that passes through the inside of the outer housing to be rotatable. Here, the outer housing is fitted into each of upper holes 38a and 39a of the support arms 38 and 39. Further, one end sides of the shaft portion are inserted into the upper portions of the opposite side plates 33 and 34 of the terminal holding section 31, and the belts 43 and 44 are hung up on the other end sides of the shaft portion. Thus, a rotational force of the shaft 45 is transmitted to the pulleys 40 and 41 through the belts 43 and 44, so that the terminal holding section 31 is rotated around a horizontal axis that connects rotational centers of the pulleys 40 and 41. Here, as shown in the figure, lengths of respective portions are set so that the middle of the horizontal axis that connects the rotational centers of the pulleys 40 and 41 becomes the standard point O.

Further, the wireless terminal 1 is held on the terminal facing surface 32a of the bottom plate 32 so that the position of the terminal antenna 1a matches the standard point O. Here, as described later, a distance from the standard point O to the terminal facing surface 32a of the bottom plate 32 is set to become a distance for reducing an influence of a reflection wave, and the distance is longer than the thickness of a housing of the wireless terminal 1. Thus, a gap occurs between a housing lower surface of the wireless terminal 1 and the terminal facing surface 32a. In this case, a method for filling the gap using a member having a wide surface in parallel with the terminal facing surface 32a of the bottom plate 32 may be considered. However, in this method, the terminal facing surface 32a substantially approaches the standard point O, and thus, it is difficult to reduce the influence of the reflection wave.

As a technique for solving the above-mentioned problem, in this embodiment, as described later, a method for performing measurement in a state where wireless terminals that are measurement targets having different sizes are fixed at desired positions, using a grid-shaped support portion formed using a plurality of plates that stand up on the terminal facing surface 32a of the bottom plate 32 in a grid form and a terminal presser capable of being locked on upper edges of the plurality of plates that form the grid-shaped support portion, is used. A configuration example of the grid-shaped support portion and the terminal presser will be described later.

Among the component members that form the terminal holding rotation mechanism 30, the terminal holding section 31, the upper surface of the base 37, and the support arms 38 and 39 are formed using a non-conductive material having a low dielectric constant, for example, a foaming material having a foaming rate of about 15 to 40 times such as a styrene board (product name Miraboard, or the like), foaming styrene, or the like. Further, a lower side of the base 37 in which metallic parts such as a motor or the like are provided is coated with the radio wave absorbent 22, to thereby prevent a bad influence on the measurement. A foaming magnification of the Miraboard is about 15 times, and a foaming magnification of the foaming styrene is about 40 times. As the foaming magnification becomes higher, a specific dielectric constant becomes closer to 1, and the strength becomes weaker. Accordingly, with respect to a large member having the same thickness, it is necessary to use a foaming member having a small foaming magnification. Further, on outer peripheral surfaces of the support arms 38 and 39, reinforcement ribs 38b and 39b are provided in a protruding manner.

Here, as a material of the pulleys 40 and 41 that are driven to be rotated, the above-described foaming material is not sufficient in view of strength. Thus, for example, a synthetic resin of a low dielectric constant (specific dielectric constant of about 2) such as Teflon (registered trademark) may be used, but in this case, a loss in the millimeter-wave band becomes large. Further, an angle at which the pulleys 40 and 41 are positioned on an axis (X-axis) that connects the standard point O and the measurement antenna 25 falls within an unmeasurable range.

The measurement unit 50 performs transmission and reception of a radio wave between the measurement antenna 25 and the wireless terminal 1 while changing the posture of the wireless terminal 1 with respect to the measurement antenna 25 to obtain characteristics of the wireless terminal 1, and includes a rotation controller 51 and a characteristic acquisition section 52.

The rotation controller 51 controls the motor of the rotation mechanism 35 to rotate the posture of the wireless terminal 1 with respect to the measurement antenna 25 from a standard posture around a vertical axis (Z-axis) passing through the standard point O and around a horizontal axis passing through the standard point O, respectively, by a predetermined step (for example, by a 1° step), and notifies the characteristic acquisition section 52 of angle information ($\theta$, $\phi$) thereof. For example, the characteristic acquisition section 52 supplies a measurement signal to the measurement antenna 25, receives a response signal from the wireless terminal 1 with respect to the measurement signal, acquires information necessary for characteristic evaluation from the response signal, stores the result together with the angle information ($\theta$, $\phi$), acquires characteristic information with respect to all postures of the wireless terminal 1 with respect to the measurement antenna 25, and outputs the measurement result. The acquired characteristics include a directional characteristic of the wireless terminal 1, a through-put characteristic, and the like.

In order to accurately perform the above-mentioned measurement, it is necessary to consider only a direct wave for directly propagating from any one of the measurement antenna 25 and the wireless terminal 1 to the other one thereof, and a reflection wave that is output from one thereof, is reflected from a different member, and is incident to the other one thereof should be suppressed as much as possible.

For this reason, the terminal holding section 31, the upper surface side of the base 37 and the support arms 38 and 39 are formed of a member having a low dielectric constant (which depends on a foaming magnification, but is generally 1.1 or lower) such as a foaming material is used. However, for example, even in a case where such a low dielectric constant member is used, in a case where an incidence angle of a radio wave is large, a reflectivity becomes greatly high.

That is, when a specific dielectric constant of a raw material that is a base of a foaming material is $\varepsilon r'$ and a foaming magnification is N, a specific dielectric constant $\varepsilon r$ of the foaming material is represented as the following expression.

$$\varepsilon r = \{(N-1) + \varepsilon r'\}/N$$

In a case where the raw material is polystyrene (specific dielectric constant $\varepsilon r'=2.25$) and the foaming magnification N is 40, the specific dielectric constant $\varepsilon r$ of the foaming material becomes about 1.03.

Figure 3:
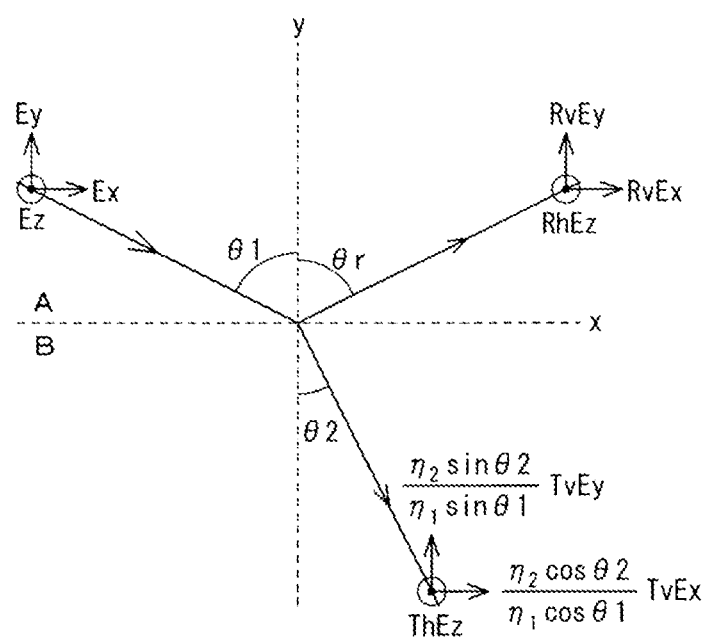
FIG. 3 is a model diagram showing reflection and transmission of a radio wave in a boundary of different mediums.

Further, with respect to a relationship between reflection and transmission of a radio wave with respect to a plane boundary, as shown in FIG. 3, for ease of description, a model in which a partial component of a radio wave that is incident at an incidence angle θ1 onto a boundary surface between a medium A having a conductive rate μ1 and a dielectric constant ε1 and a medium B having a conductive rate μ2 and a dielectric constant ε2 permeates into the medium B at a permeation angle θ2 and the remaining component is reflected at a reflection angle θr from the medium A is reviewed on the basis of division of the incidence wave into vertical polarized wave components Ex and Ey and a horizontal polarized wave component Ez.

According to the Snell's law, the incidence angle θ1 and the reflection angle θr are equal to each other. Further, in a case where a refractive index is n, $\eta 1=\sqrt{(\mu 1/\varepsilon 1)}$, $\eta 2=\sqrt{(\mu 2/\varepsilon 2)}$, and $n^2=\varepsilon 2/\varepsilon 1$=(specific dielectric constant εr of medium B with respect to medium A), it is known that a reflection coefficient Rh and a permeation coefficient Th of a horizontal polarized wave component, and a reflection coefficient Rv and a permeation coefficient Tv of a vertical polarized wave component are given as follows.

$$Rh=\{\cos\theta 1-\sqrt{(n^2-\sin^2\theta 1)}\}/\{\cos\theta 1+\sqrt{(n^2-\sin^2\theta 1)}\}$$

$$Rv=\{n^2\cos\theta 1-\sqrt{(n^2-\sin^2\theta 1)}\}/\{n^2\cos\theta 1-\sqrt{(n^2-\sin^2\theta 1)}\}$$

$$Th=2\cos\theta 1/\{\cos\theta 1+\sqrt{(n^2-\sin^2\theta 1)}\}$$

$$Tv=2n^2\cos\theta 1/\{n^2\cos\theta 1+\sqrt{(n^2-\sin^2\theta 1)}\}$$

Among the above-mentioned expressions, in a case where changes of the reflection coefficients Rh and Rv with respect to the incidence angle θ1 are reviewed, when θ1 is 0°, $\cos\theta 1=1$ and $\sin^2\theta 1=0$. Accordingly, the following expressions are obtained.

$$Rh=(1-n)/(1+n)$$

$$Rv=(n^2-n)/(n^2+n)=(n-1)/(n+1)$$

Here, in a case where both absolute values |Rh| and |Rv| are equal to each other and the medium B is foaming styrene having a foaming magnification of 40, n=εr=1.03. Accordingly, |Rh|=|Rv|=0.03/2.03≅0.015.

Here, any reflectivity is equal to or smaller than 0.1, which is close to 0. Thus, most of the incidence wave enters and permeates into the medium B.

Further, when the incidence angle θ1 is 45°, since $\cos\theta 1=1/\sqrt{2}$ and $\sin^2\theta 1=\frac{1}{2}$, the following expressions are obtained.

$$Rh=\{(1/\sqrt{2})-\sqrt{(n^2-\frac{1}{2})}\}/\{(1/\sqrt{2})+\sqrt{(n^2-\frac{1}{2})}\}$$

$$Rv=\{n^2(1/\sqrt{2})-\sqrt{(n^2-\frac{1}{2})}\}/\{n^2(1/\sqrt{2})+\sqrt{(n^2-\frac{1}{2})}\}$$

When n is 1.03, |Rh|≅0.03 and |Rv|≅0. In this case, any reflectivity is equal to or smaller than 0.1, which is close to 0. Thus, most of the incidence wave enters and permeates into the medium B.

Further, when the incidence angle θ1 is 60°, since $\cos\theta 1=\frac{1}{2}$ and $\sin^2\theta 1=\frac{3}{4}$, the following expressions are obtained.

$$Rh=\{(\frac{1}{2})-\sqrt{(n^2-\frac{3}{4})}\}/\{(\frac{1}{2})+\sqrt{(n^2-\frac{3}{4})}\}$$

$$Rv=\{n^2/2-\sqrt{(n^2-\frac{3}{4})}\}/\{n^2/2+\sqrt{(n^2-\frac{3}{4})}\}$$

When n is 1.03, |Rh|≅0.05 and |Rv|≅0. In this case, any reflectivity is equal to or smaller than 0.1, and thus, most of the incidence wave enters and permeates into the medium B.

Further, when the incidence angle θ1 is 80°, since $\cos\theta 1\cong 0.736$ and $\sin^2\theta 1\cong 0.970$, when n is 1.03, |Rh|≅0.42 and |Rv|≅0.44. In this case, any reflectivity is almost equal to or larger than 0.4. Thus, 40% or more of the incidence angle is reflected.

Further, when the incidence angle θ1 is set to be very close to 90°, since $\cos\theta 1\cong 0$ and $\sin^2\theta 1\cong 1$, the following expressions are obtained.

$$|Rh|=|\{-\sqrt{(n^2-1)}\}/\{\sqrt{(n^2-1)}\}|\cong 1$$

$$|Rv|=|\{-\sqrt{(n^2-1)}\}/\{\sqrt{(n^2-1)}\}|\cong 1$$

Any reflectivity becomes about 1 regardless of the value of n, and almost the entirety of the incidence wave is reflected.

Figure 4:
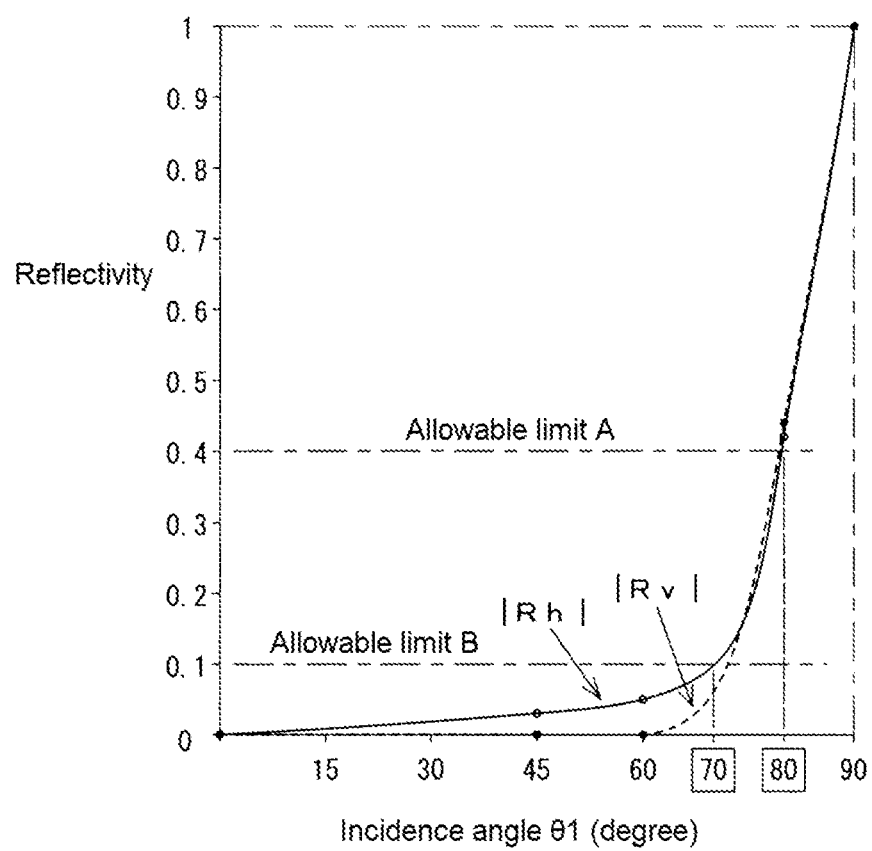
FIG. 4 is a diagram illustrating a characteristic of incidence angle-to-reflectivity when a foaming material of a specific dielectric constant of 1.03 is used.

From the calculation results, in a case where a foaming material having a foaming magnification of 40 and a specific dielectric constant 1.03 is used as the medium B, a change of a reflectivity with respect to an incidence angle is as follows. As shown in FIG. 4, it can be understood that, in a range where the incidence angle θ1 is smaller than 70°, the reflectivity is equal to or smaller than 0.1, which is very small, and in a range where the incidence angle θ1 is 70° to 90°, the reflectivity becomes rapidly high.

In this way, in a case where the reflectivity is high, it affects measurement based on a direct wave. Accordingly, in a case where an allowable limit of the reflectivity is set to 0.4 (allowable limit A), it is necessary to limit the incidence angle to be 80° or smaller. Further, in a case where high measurement accuracy is necessary, and in a case where the allowable limit of the reflectivity is set to 0.1 (allowable limit B), it is necessary to limit the incidence angle to be 70° or smaller.

Accordingly, in the wireless terminal measurement apparatus 20 of this embodiment, a distance H from the standard point O to the terminal facing surface 32a is set so that an incidence angle of a radio wave with respect to the terminal facing surface 32a of the bottom plate 32 of the terminal holding section 31 is equal to or smaller than the limit angle.

By experimentally changing the distance with respect to the distance H, the degree of influence on the measurement is calculated. Hereinafter, this will be described.

An experiment is performed in such a manner that a standard antenna (not shown) having the same structure as that of a terminal antenna or a measurement antenna, for example, is fixed on the standard point O, a radio wave of a predetermined power is transmitted from the measurement antenna 25 while rotating the terminal holding section 31 around on the standard point O, the radio wave is received in the standard antenna, a reception power is measured, and an influence on the transmission and reception due to a rotational angle of the terminal holding section 31 (in which the transmission and reception may be reversely performed). Here, in order to check an influence of a measurement system, the standard antenna is fixed on the standard point O by a different support method (for example, a method for suspending the standard antenna from an upper portion of an inner wall of the radio wave anechoic box 21 using a filament) in a predetermined posture, without being held by the terminal holding section 31.

In this state, changes of measurement values when the materials of the terminal holding section 31 and the base 37 and the depth from the horizontal rotational axis of the terminal holding section 31 (that is, the distance H from the standard point O to the terminal facing surface 32a of the bottom plate 32 of the terminal holding section 31) are changed are calculated for each rotation angle. Here, before the calculation, examples of the dimensions are geometrically checked with reference to FIG. 5.

Figure 5A:
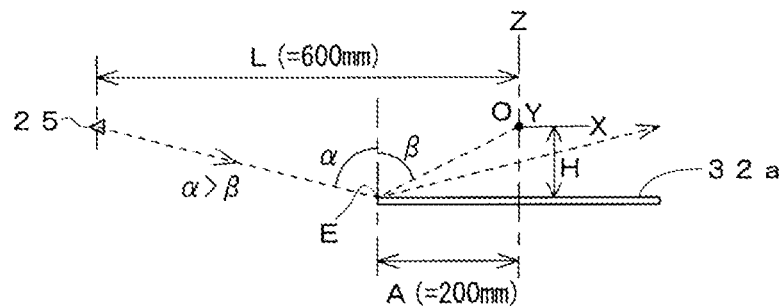
FIGS. 5A and 5B are diagrams illustrating a change of an incidence angle based on rotation of a terminal holding section around a horizontal axis.

In FIG. 5A, it is assumed that a vertical axis that passes through the standard point O in which a standard antenna is disposed is the Z-axis, an axis that is orthogonal to the Z-axis at the standard point O and extends to the measurement antenna 25 is the X-axis, and a line that is orthogonal to the Z-axis and the X-axis at the standard point O is the Y-axis. Further, when a distance from the standard point O to the measurement antenna 25 is L (=600 mm), a distance from the standard point O to the center of the terminal facing surface 32a is H, and a distance from the center of the terminal facing surface 32a to an edge thereof is A (=400 mm/2=200 mm), a position where the horizontal rotational axis of the terminal holding section 31 overlaps the Y-axis and the terminal facing surface 32a is in a horizontal state below the standard point O is set as a standard state.

In this standard state, the distance A (=200 mm) from the Z-axis to an edge position E of the terminal facing surface 32a on the side of the measurement antenna 25 is smaller than a half of the distance L (=600 mm) from the Z-axis that passes through the standard point O to the measurement antenna 25.

Accordingly, an angle β formed by a line from the edge position E to the standard point O and a normal line of the terminal facing surface 32a is constantly smaller than an incidence angle α of a radio wave that is output from the measurement antenna 25 and is incident to the edge position E (α>β), a component that is reflected at the edge position E at a reflection angle α passes between the standard point O and the terminal facing surface 32a. Here, an actual radio wave has beam divergence and an antenna has an aperture of a predetermined area, a reflection component passing through the vicinity of the standard point O is received into the standard antenna, but herein, for ease of description, the beam divergence and the aperture of the antenna are to be ignored.

In this way, in the examples of the numerical values, in the standard state, a component that is output from the measurement antenna 25 and is reflected from the terminal facing surface 32a passes between the standard point O and the terminal facing surface 32a of the bottom plate 32, regardless of the distance H from the standard point O to the terminal facing surface 32a.

Figure 5B:
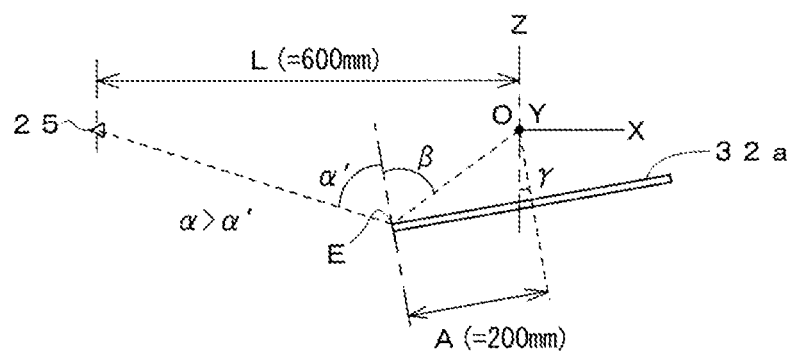

However, as shown in FIG. 5B, in a state where the terminal holding section 31 is rotated around the Y-axis by an angle γ, an incidence angle α' of a radio wave that is incident to the edge position E becomes smaller than the incidence angle α in the standard state as the terminal facing surface 32a is tilted by the angle γ. On the other hand, the angle β formed by the line from the edge position E to the standard point O and the normal line of the terminal facing surface 32a is constant regardless of the angle γ.

Accordingly, as the angle γ increases, the incidence angle α' becomes identical to the angle β. Thus, the reflection component at the edge position E becomes a reflection wave that is incident to the standard point O, and is incident to the standard antenna together with a direct wave, so that an influence on the measurement cannot be ignored. Here, as described above, in a case where the incidence angle α' is formed to be equal to or smaller than 80°, for example, a reflectivity of a reflection wave becomes small and a level difference between the reflection wave and a direct wave becomes large. Thus, it is possible to reduce an influence on the measurement.

Next, an experiment result obtained by actually checking an influence on a reflection wave will be described.

Figure 6:
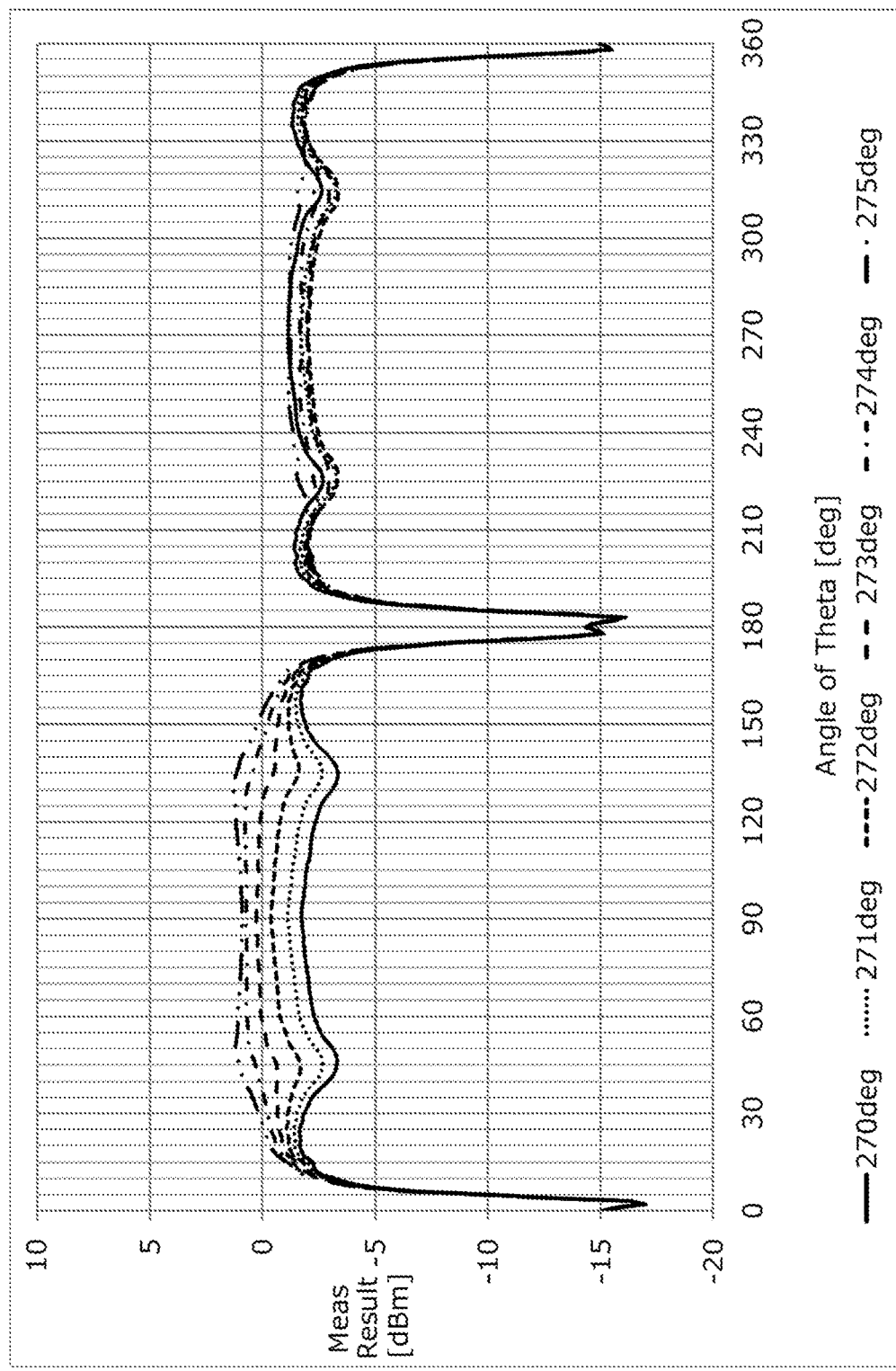
FIG. 6 is a diagram showing a measurement result when a distance H from a standard point to a terminal facing surface of a bottom plate is 25 mm.

FIG. 6 shows measurement results in a case where the terminal holding section 31 and the base 37 (including the support arms 38 and 39) are made of foaming styrene of a foaming magnification of 40 and the distance H from the standard point O to the terminal facing surface 32a is set to 25 mm.

A lateral axis in FIG. 6 represents an angle θ around the Z-axis (in which the standard state is θ=90°), and a longitudinal axis represents measurement results of signal strengths. That is, the longitudinal axis shows measurement results when an angle φ around the horizontal axis is changed by 1° from 270° (standard state) to 275°.

As is obvious from the measurement results, it can be understood that, in a range where the lateral axis θ is 15° to 165°, when the angle φ around the horizontal axis (angle of the terminal facing surface 32a) is tilted leftward by 1° from the horizontal state (270°), a deviation of the measurement results is widened to a range of −2 to +1 dBm. It is considered that the large deviation of the measurement values results from the fact that the above-mentioned influence of the reflection wave from the terminal facing surface 32a strongly appears. As described above, in the experiment, due to the influence of the antenna aperture, the beam width, or the like, it can be understood that the influence of the reflection wave strongly appears even in the standard state (270°).

In this case, the angle β is in a range where $β=90-\tan^{-1}(H/A)=90-\tan^{-1}(25/200)\cong 82.9$ (degree), which exceeds 80°. Thus, since a radio wave that is incident at an incidence angle close to the angle β is reflected at a very large reflectivity, and is output in the vicinity of the standard point O, a large deviation appears in the above-mentioned measurement results.

Further, in a range where the lateral axis θ is 195° to 345°, a direct wave is input to the standard antenna through the hole 32b. Here, a radio wave that is incident on a peripheral side of the hole 32b is incident at a shallow angle on the surface opposite to the terminal facing surface 32a, and most of the radio wave is reflected. Thus, the deviation of the measurement value decreases.

In this measurement results, large attenuations in the ranges where the lateral axis θ is 0° to 15°, 165° to 190°, and 345° to 360° are due to loss of the pulleys 40 and 41. Further, it is considered that fluctuations in the vicinity of the lateral axis 45°, 135°, 225°, and 315° are due to a phenomenon that a corner portion of the terminal facing surface 32a having a rectangular appearance is closer to the measurement antenna 25 and the incidence angle is closer to 0 and due to the influence of the side plates 33 and 34 of the terminal holding section 31.

Figure 7:
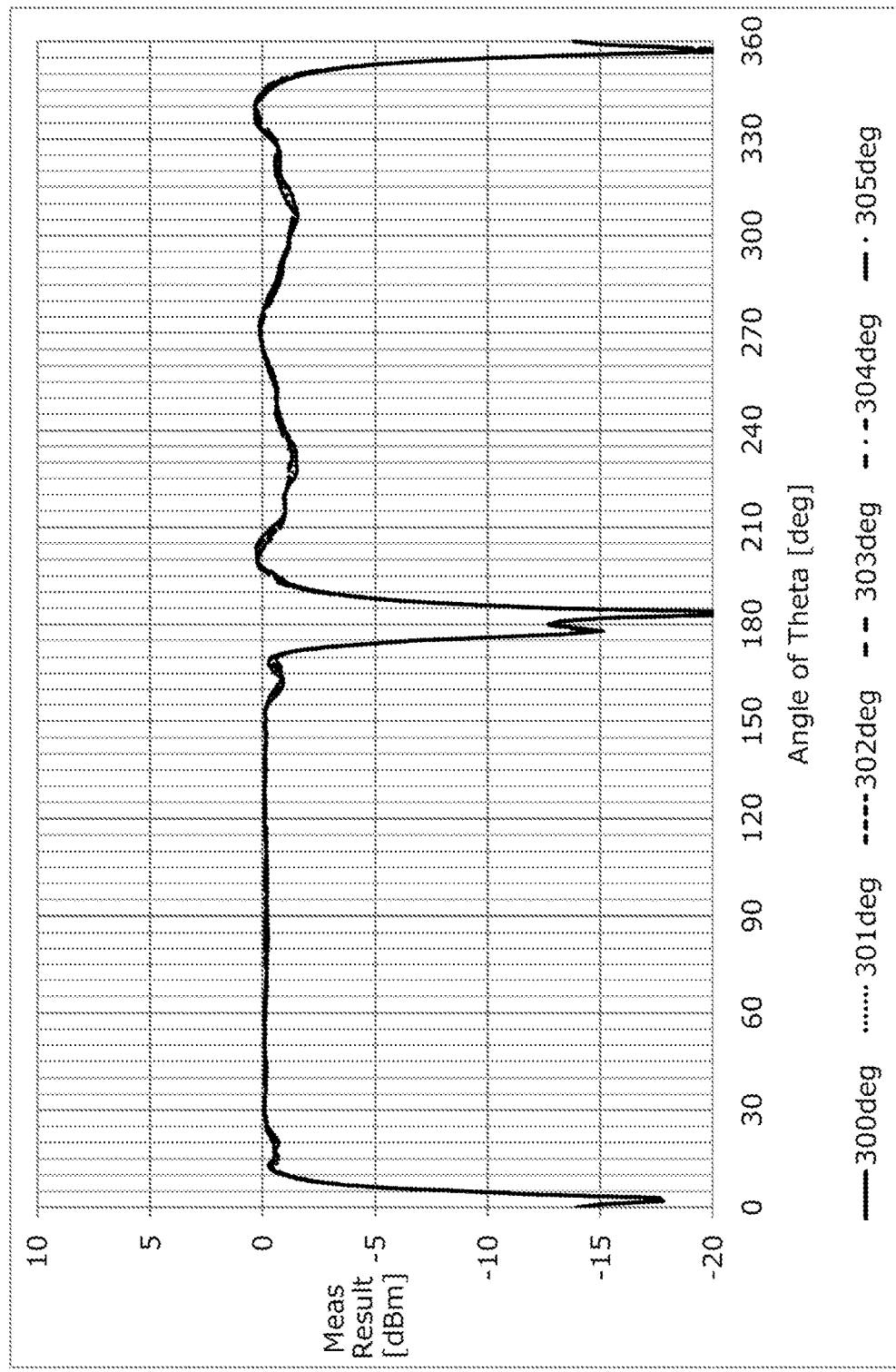
FIG. 7 is a diagram showing a measurement result when the distance H from the standard point to the terminal facing surface of the bottom plate is 25 mm.

FIG. 7 shows measurement results in a case where H is 25 mm and the angle φ around the horizontal axis is changed from 300° to 305° by 1°, in a similar way to the above description. As the angle of the terminal facing surface 32a is tilted by an angle of 30° or greater from the standard state, an incidence angle of an incidence wave with respect to the terminal facing surface 32a becomes small, and a reflectivity is rapidly changed. Thus, an influence of a reflection wave on a direct wave does not nearly appear, a deviation of measurement results of changes of the angle φ around the horizontal axis is also very small.

Figure 8:
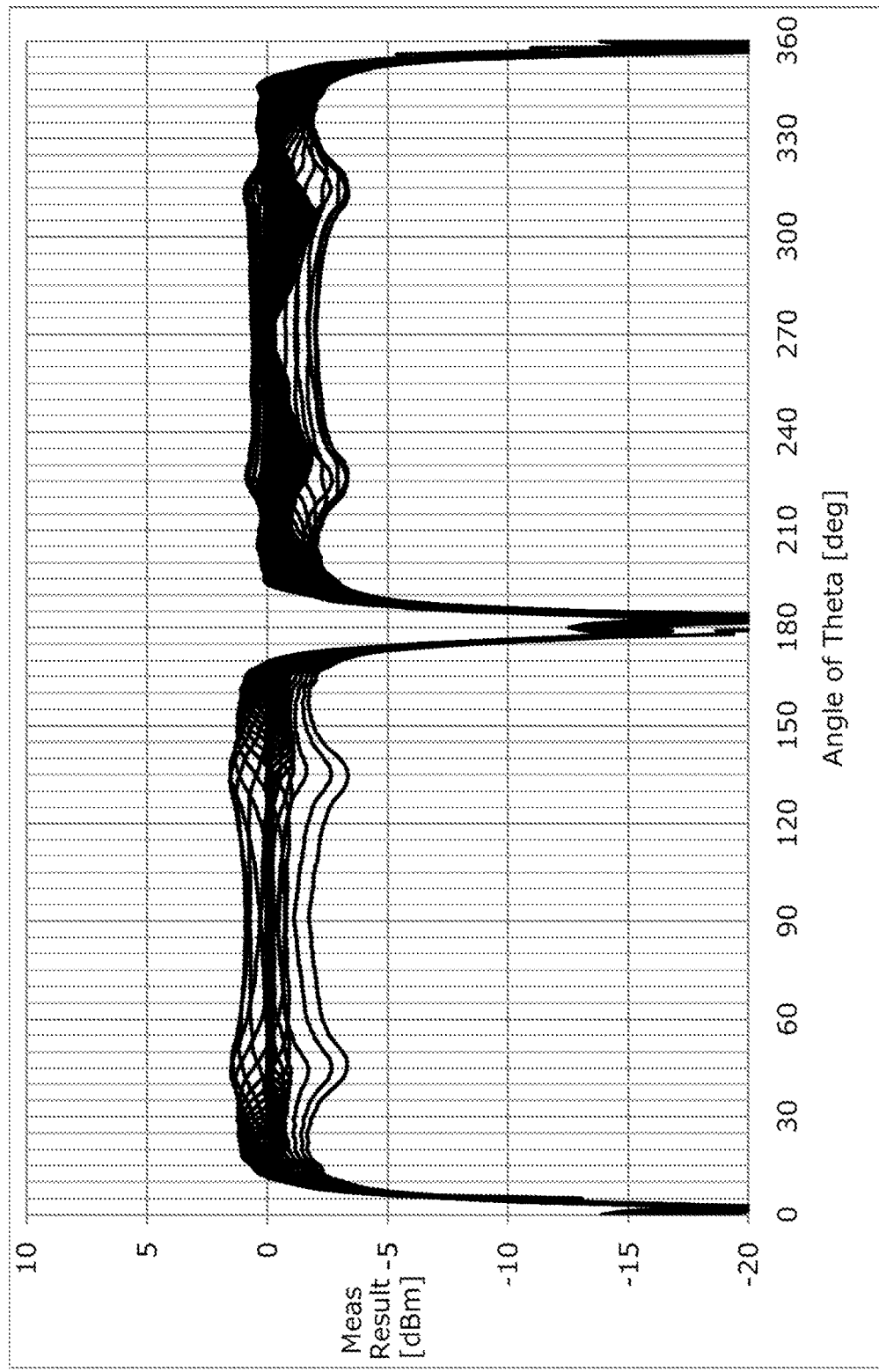
FIG. 8 is a diagram showing a measurement result when the distance H from the standard point to the terminal facing surface of the bottom plate is 25 mm.

FIG. 8 shows measurement results in a case where H is 25 mm and the angle φ around the horizontal axis is changed from 270° (standard state) to 360° (upright state), in an overlapping manner, in a similar way to the above description. In a range where the lateral axis θ is 15° to 165°, a deviation of the measurement results is widened to a range of about −3.5 to about +1.5 dBm. In a range where the lateral axis θ is 195° to 345°, a deviation of the measurement results is widened to a range of about −3.5 to about +1 dBm. Accordingly, as a whole, it is difficult to perform measurement with high accuracy.

Figure 9:
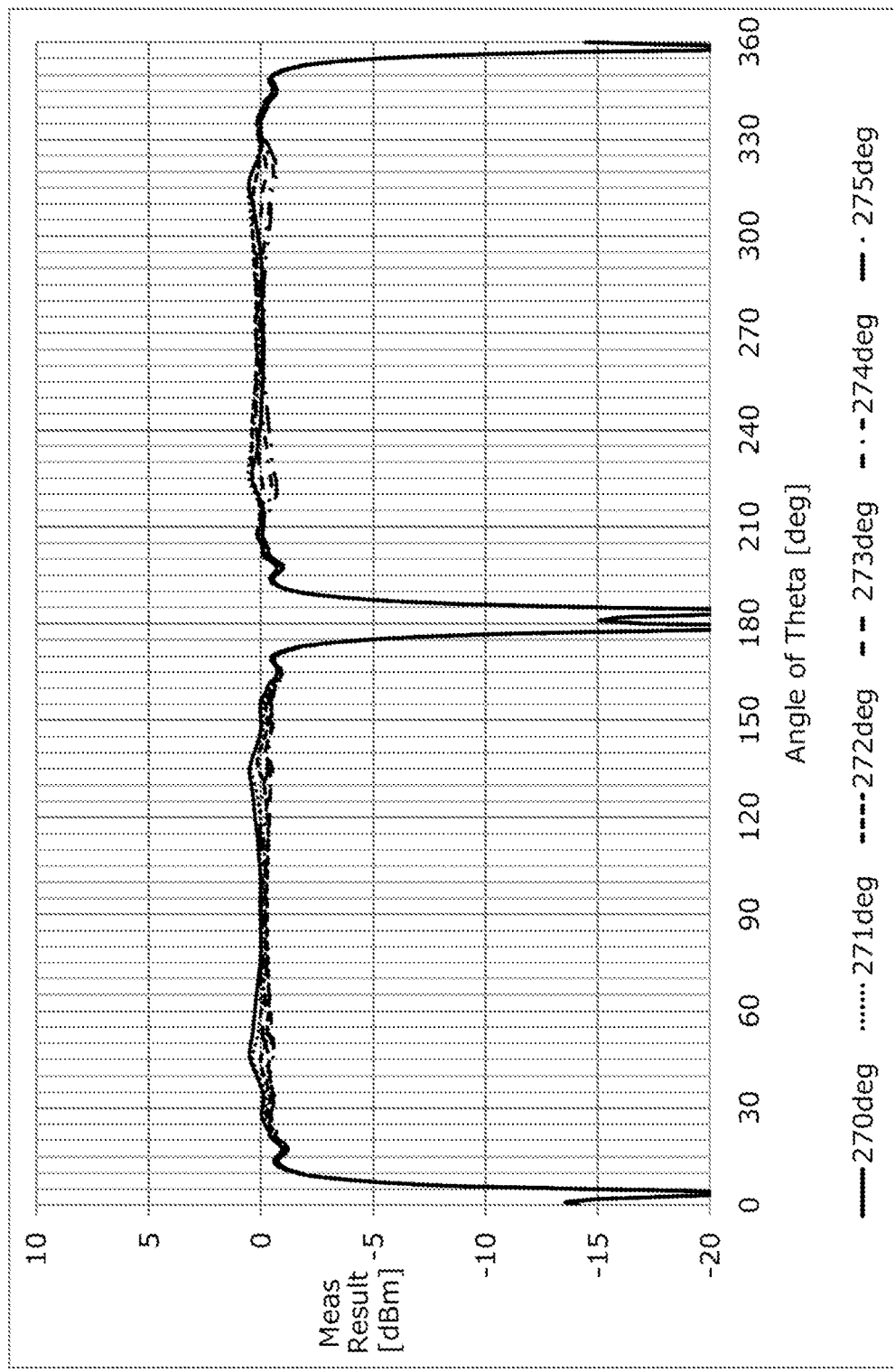
FIG. 9 is a diagram showing a measurement result when the distance H from the standard point to the terminal facing surface of the bottom plate is 70 mm.

FIG. 9 shows measurement results when the angle φ around the horizontal axis is changed from 270° (standard position) to 275° by 1° in a case where the distance H from the standard point O to the terminal facing surface 32a is set to 70 mm. In this example, in order to secure the strength, the Miraboard is used as the material of the base 37 (including the support arms 38 and 39), instead of a foaming styrene.

In the measurement results shown in FIG. 9, in a case where a deviation of the measurement results with respect to the changes of the angle φ around the horizontal axis is within −1 to +0.5 dbm. Here, in a case where the lateral axis θ is limited to 30° to 150°, and 210° to 330°, the deviation is within −0.5 to +0.5 dBm. Thus, it can be understood that the measurement accuracy is considerably enhanced, compared with the measurement results shown in FIG. 6.

This is a result obtained by changing the distance H from the standard point O to the terminal facing surface 32a of the bottom plate 32 from 25 mm to 70 mm, in which the angle $\beta = 90 - \tan^{-1}(70/200) \cong 70.7$ (degree), which becomes smaller than 80°. This is because the reflectivity noticeably becomes small, so that an influence on a direct wave becomes very small.

Figure 10:
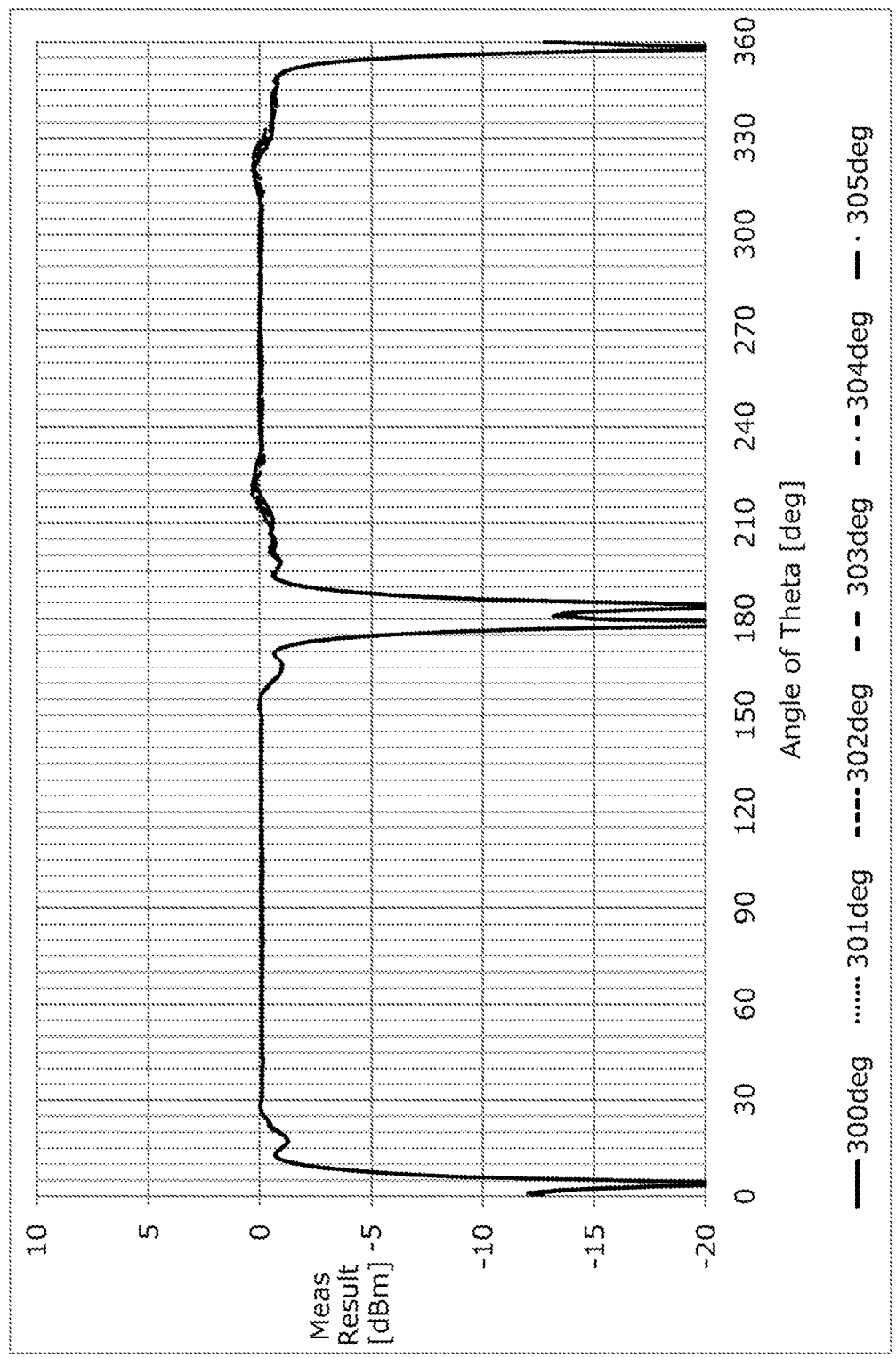
FIG. 10 is a diagram showing a measurement result when the distance H from the standard point to the terminal facing surface of the bottom plate is 70 mm.

FIG. 10 shows measurement results in a case where H is 70 mm and the angle φ around the horizontal axis is changed from 300° to 305° by 1°, in a similar way to the above description. As described above, as the angle of the terminal facing surface 32a becomes large by an angle of 30° or greater from the standard state, an incidence angle of an incidence wave with respect to the terminal facing surface 32a becomes small, and the reflectivity is rapidly reduced. Thus, an influence of a reflection wave on a direct wave does not nearly appear, a deviation of measurement results of changes of the angle φ around the horizontal axis is also very small.

Figure 11:
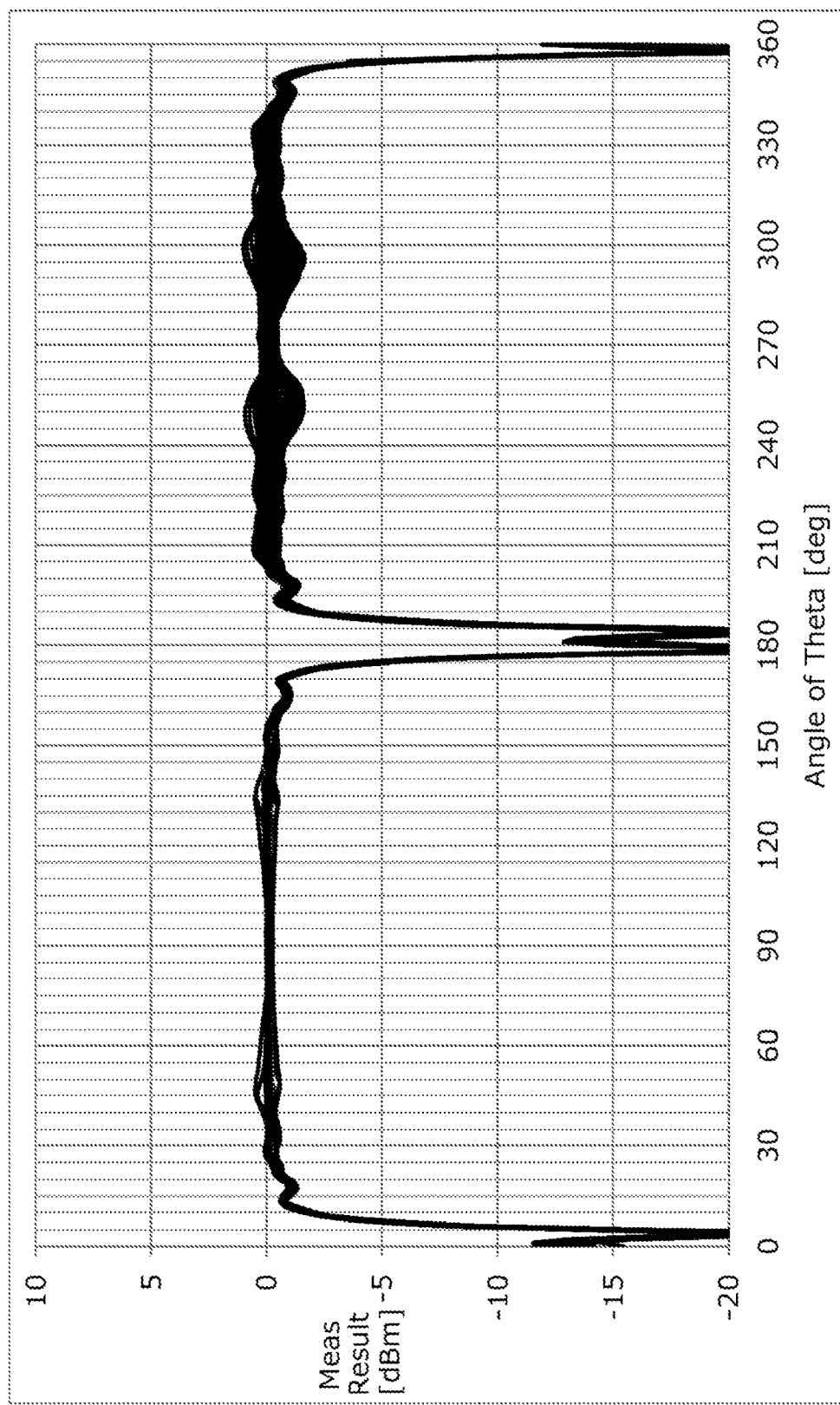
FIG. 11 is a diagram showing a measurement result when the distance H from the standard point to the terminal facing surface of the bottom plate is 70 mm.

FIG. 11 shows measurement results in a case where H is 70 mm and the angle φ around the horizontal axis is changed from 270° (standard state) to 360° (upright state), in an overlapping manner, in a similar way to the above description. In a range where the lateral axis θ is 15° to 165°, a deviation of the measurement results is widened to a range of about −1.5 to about +0.5 dBm. In a range where the lateral axis θ is 195° to 345°, a deviation of the measurement results is widened to a range of about −2.5 to about +1 dBm. Accordingly, as a whole, it is possible to perform measurement with high accuracy.

Figure 12:
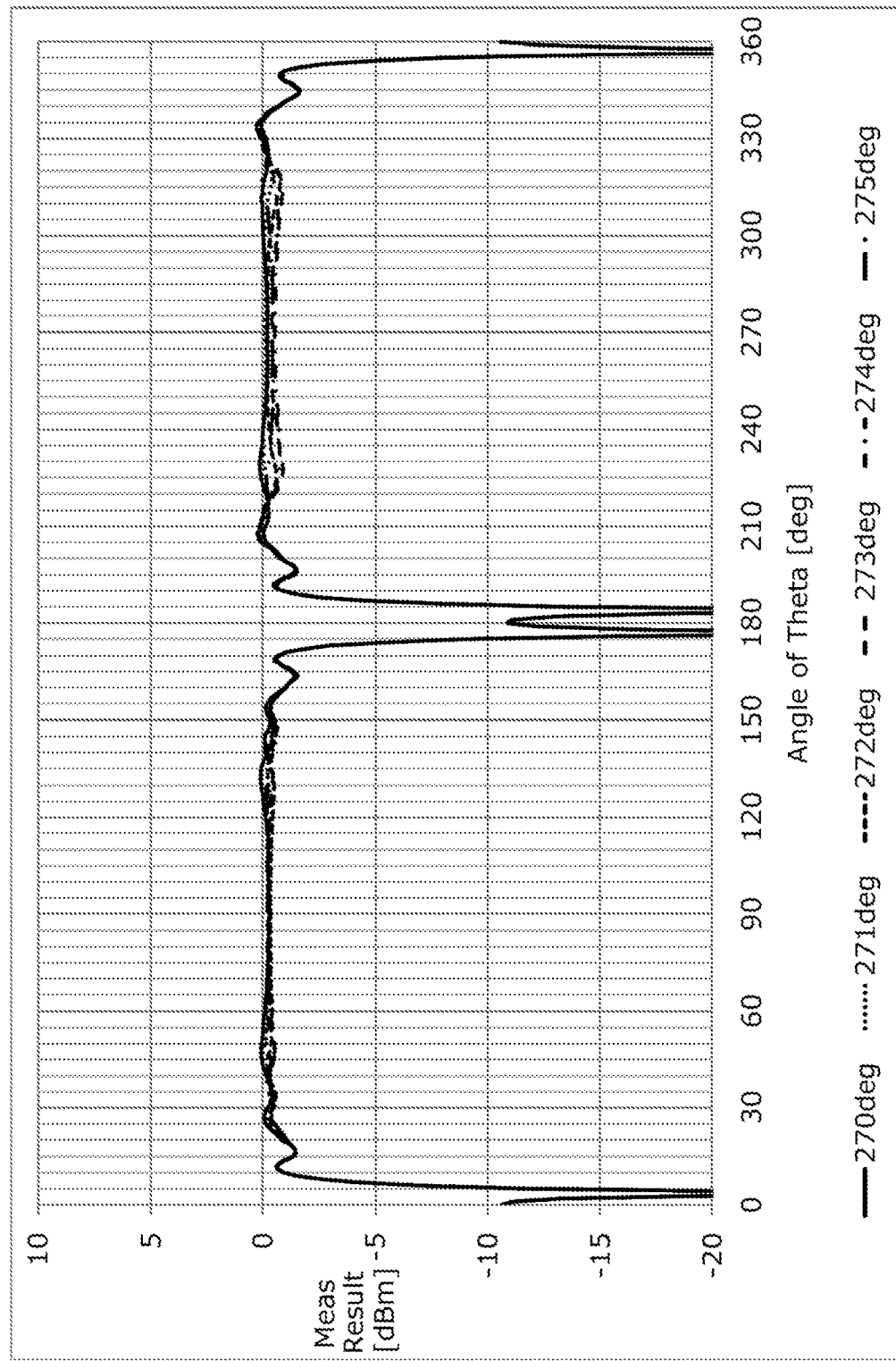
FIG. 12 is a diagram showing a measurement result when the distance H from the standard point to the terminal facing surface of the bottom plate is 90 mm.

FIG. 12 shows measurement results when the angle φ around the horizontal axis is changed from 270° (standard position) to 275° by 1° in a case where the distance H from the standard point O to the terminal facing surface 32a is set to 90 mm. In this example, in order to secure the strength, the Miraboard is used as the materials of the terminal holding section 31 and the base 37, instead of a foaming styrene.

In the measurement results shown in FIG. 12, a deviation of the measurement results with respect to the changes of the angle φ around the horizontal axis is within −1.5 to +0.5 dbm. Thus, it can be understood that the measurement accuracy is considerably enhanced, compared with the measurement results shown in FIG. 6. Further, almost the same results as the measurement results shown in FIG. 9 are obtained.

In this case, the angle β is in a range where $\beta = 90 - \tan^{-1}(90/200) \cong 65.8$ (degree), which is smaller than the angle β shown in FIG. 9. Thus, since the reflectivity noticeably becomes small, an influence on a direct wave becomes very small.

Figure 13:
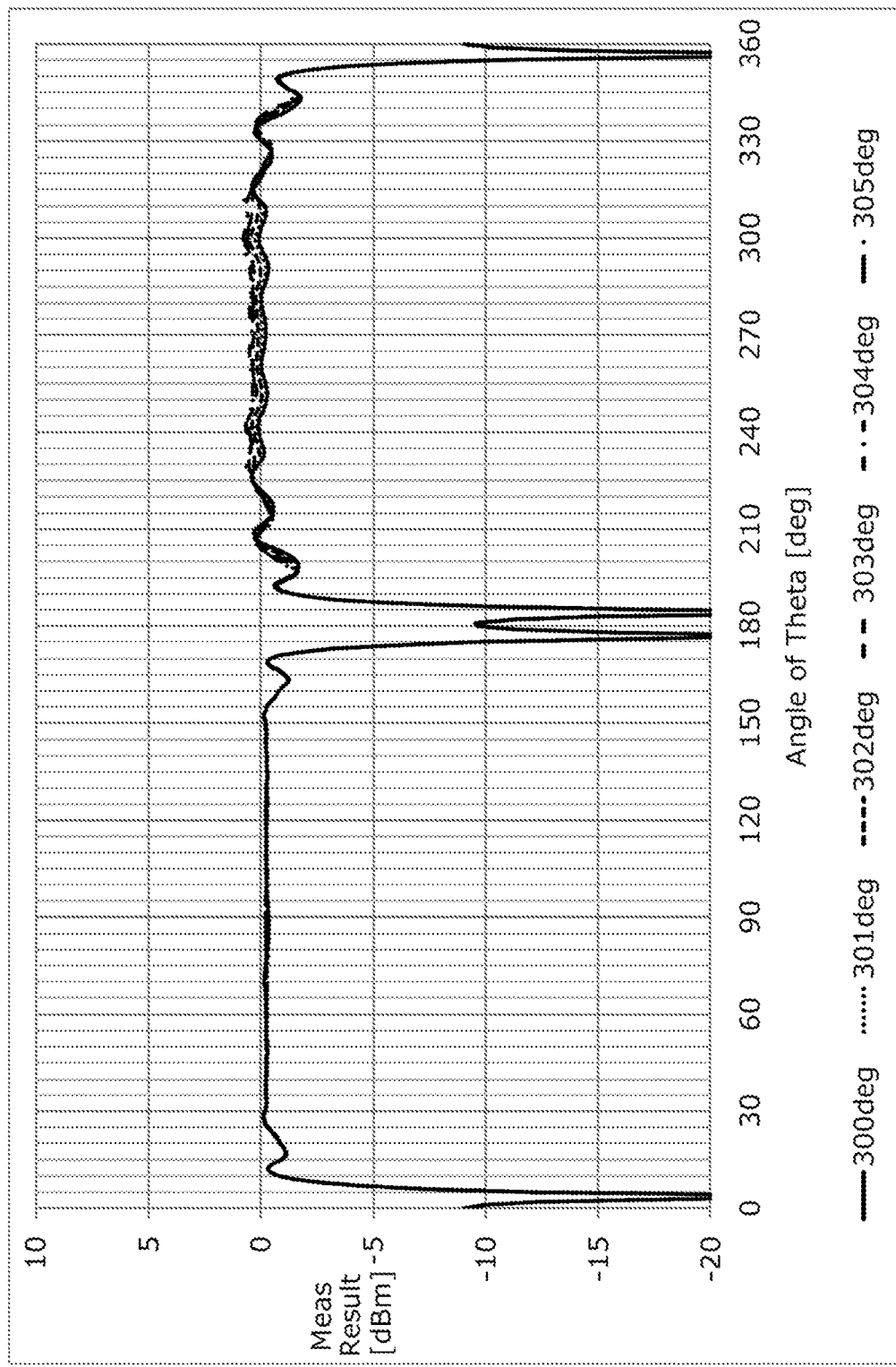
FIG. 13 is a diagram showing a measurement result when the distance H from the standard point to the terminal facing surface of the bottom plate is 90 mm.

FIG. 13 shows measurement results in a case where H is 90 mm and the angle φ around the horizontal axis is changed from 300° to 305° by 1°, in a similar way to the above description. As described above, as the angle of the terminal facing surface 32a is greatly changed by an angle of 30° or greater from the standard state, an incidence angle of an incidence wave with respect to the terminal facing surface 32a becomes small, and the reflectivity is rapidly reduced. Thus, an influence of a reflection wave on a direct wave does not nearly appear, a deviation of measurement results of changes of the angle φ around the horizontal axis is also very small. Here, compared with the measurement results shown in FIG. 10, a fluctuation in a range where the lateral axis θ is 195° to 345° becomes large. It is considered that the fluctuation is due to the influence of the material of the Miraboard.

Figure 14:
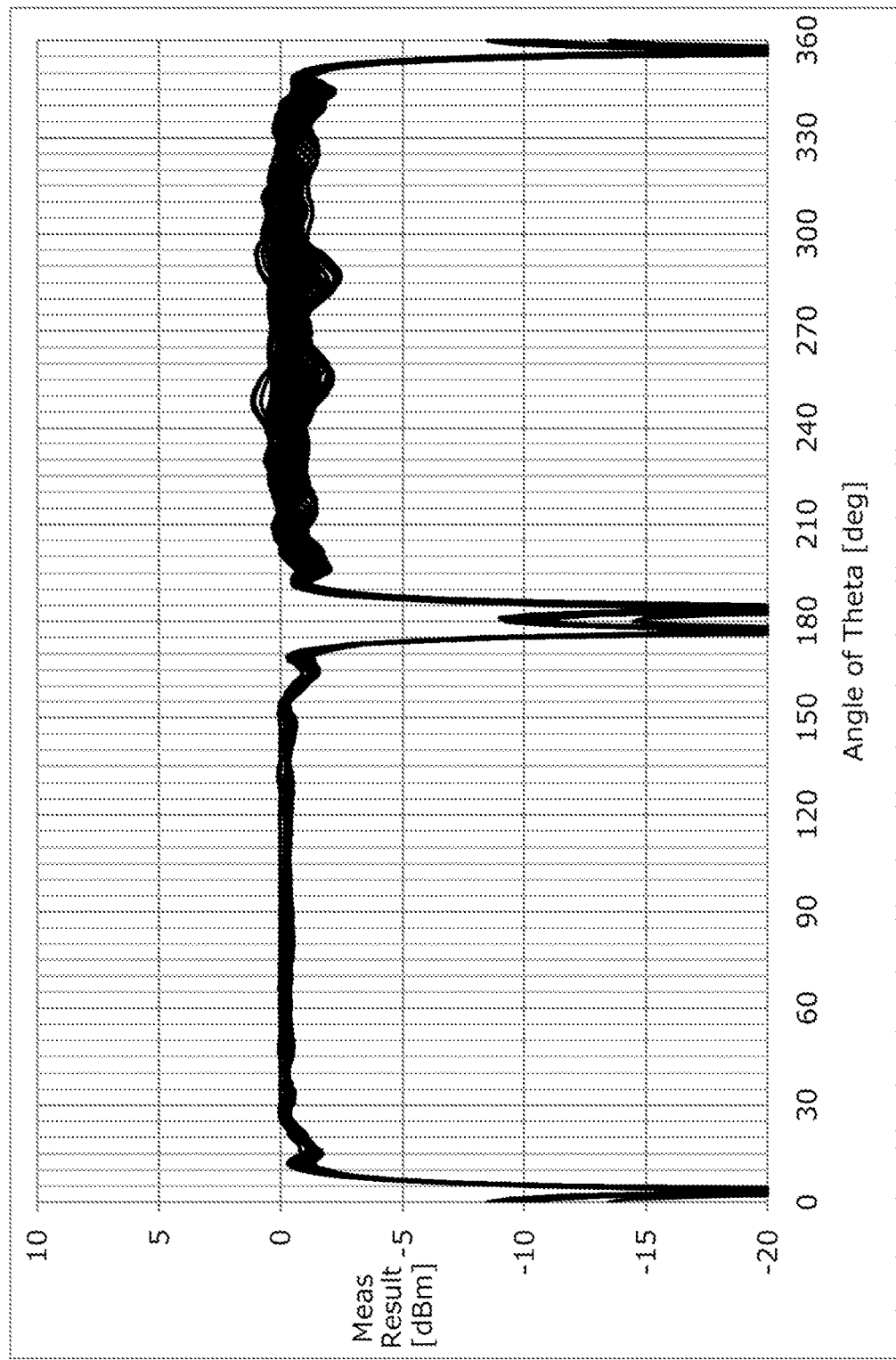
FIG. 14 is a diagram showing a measurement result when the distance H from the standard point to the terminal facing surface of the bottom plate is 90 mm.

FIG. 14 shows measurement results in a case where H is 90 mm and the angle φ around the horizontal axis is changed from 270° (standard state) to 360° (upright state), in an overlapping manner, in a similar way to the above description. In a range where the lateral axis θ is 15° to 165°, a deviation of the measurement results is widened to a range of about −1.8 to about +0.1 dBm. In a range where the lateral axis θ is 195° to 345°, a deviation of the measurement results is scattered in a range of about −2.5 to about +1.3 dBm. Accordingly, the measurement results in FIG. 14 are inferior to the measurement results shown in FIG. 11 in which H is 70 mm.

Further, the distance H may be set to be larger, but the depth of the terminal holding section 31 (the distance from the horizontal axis to the terminal facing surface 32a of the bottom plate 32) becomes larger. Accordingly, it is necessary to enlarge a region necessary for its rotation. Thus, the measurement system becomes large. Further, in order to secure the strength, it is necessary to use a member with a lower foaming rate, and it is expected that a fluctuation of the above-described measurement results as in H=90 mm becomes large.

Accordingly, in the above-described examples of the numerical values, it can be understood that a configuration in which H is set to 70 mm, the base 37 is made of the Miraboard, and the terminal holding section 31 is formed of foaming styrene of a foaming magnification of 40 shows the best measurement results.

Here, the value of H=70 mm is an example of numerical values in which the angle β is equal to or smaller than 80° in a case where L is 600 mm and A is 200 mm, but it is expected that the same measurement results can be obtained even in a case where H is 65 mm to 75 mm. Further, in a case where the values of L and A are changed, it is also necessary to change the distance H from the standard point O to the terminal facing surface 32a for setting the angle θ to be equal to or smaller than the allowable angle (80°).

That is, with respect to an allowable angle $\beta_R$ (in the above-described example, 80° or 70°) for assigning a reflectivity (in the above-described example, 0.4 or 0.1) allowed in the characteristic of the angle-to-reflectivity in FIG. 4 that is calculated from the material of the terminal holding section 31, the angle β represented by $\beta = 90 - \tan^{-1}(H/A)$ may be set to become small.

This can be realized by setting the value of (H/A) to be large on the numerical expression, but in a case where A is set to be small (the area of the terminal facing surface 32a is reduced), it is difficult to support a large wireless terminal such as a tablet. Further, in a case where H is set to be large, the radius of rotation of the terminal holding section 31 becomes large, which causes an increase in size of the measurement system. Accordingly, a member having a low foaming magnification should be used in order to secure the strength, which leads to a great influence of its reflection. Finally, since A is determined by the size of a wireless terminal that is a measurement target, as described above, it is necessary to set H in an appropriate range.

In the above-described configuration example, the distance L (=600 mm) from the standard point O to the measurement antenna 25 is set to be larger than two times the distance A (=200 mm) from the center of the terminal facing surface to the edge, but in a case where the magnification of L with respect to A is set to be larger, the incidence angle α with respect to the edge position E of the terminal facing surface 32a becomes larger, so that the reflectivity becomes higher. Here, in a case where L is set to be larger, since the size of the measurement system becomes larger and the propagation loss in a millimeter-wave band noticeably increases, it is considered that a limit value of L is about 1000 mm.

Contrarily, in a case where the magnification of L with respect to A is set to be smaller, for example, L=2A, in the standard state, the incidence angle α with respect to the edge position E of the terminal facing surface 32a become smaller and the reflectivity becomes small. However, since the reflection angle matches β, a reflection wave passes through the standard point O.

Further, in a case where the magnification of L with respect to A is set to be further smaller, for example L<2A, the incidence angle α with respect to the edge position E of the terminal facing surface 32a is set to be further smaller, so that the reflectivity at the edge position E becomes further smaller. However, the reflection angle at the edge position E becomes smaller than β, and a reflection wave from the edge position passes above the reference point O. Here, in this case, in the standard state, the incidence angle α of the radio wave that is incident to any inner position with reference to the edge position E of the terminal facing surface 32a becomes identical to β, and a reflection wave from the position passes through the standard point O.

In the above-described cases, similarly, in a case where H is set with respect to A so that a reflectivity of a radio wave that is incident on the terminal facing surface 32a and is reflected at an angle for passing through the reference point O and the vicinity thereof becomes smaller than an allowable reflectivity, it is possible to sufficiently reduce an influence on measurement due to a direct wave.

From the experiment results, it can be understood that in a case where the distance H from the standard point O to the terminal facing surface 32a of the bottom plate 32 of the terminal holding section 31 is set to about 70 mm, an influence of a reflection wave is small, but since the thickness of the wireless terminal 1 such as a mobile phone, a smartphone, or a tablet is much thinner than 70 mm (generally, 10 mm or thinner), in order to horizontally hold the wireless terminal 1 in a state where the position of a terminal antenna therein (assuming that the terminal antenna is positioned at the center of the thickness) matches the standard point O, as described above, it is necessary to support the wireless terminal 1 at a position that is high by (H−α) mm from the terminal facing surface 32a of the bottom plate 32 (α is a distance from the lower surface of the housing of the terminal to the terminal antenna, which is, for example, about ½ of the thickness of the housing of the terminal).

Figure 15:
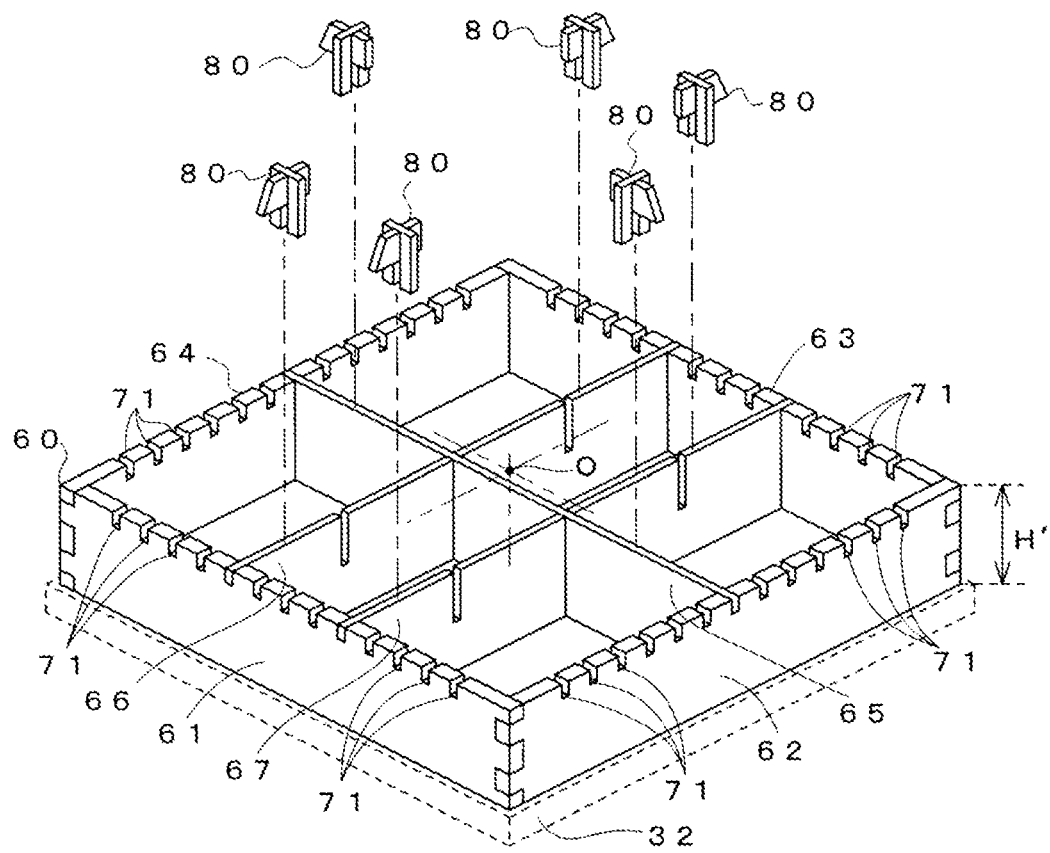
FIG. 15 is a diagram showing a configuration example of a grid-shaped support portion used in the terminal holding section.
Figure 16:
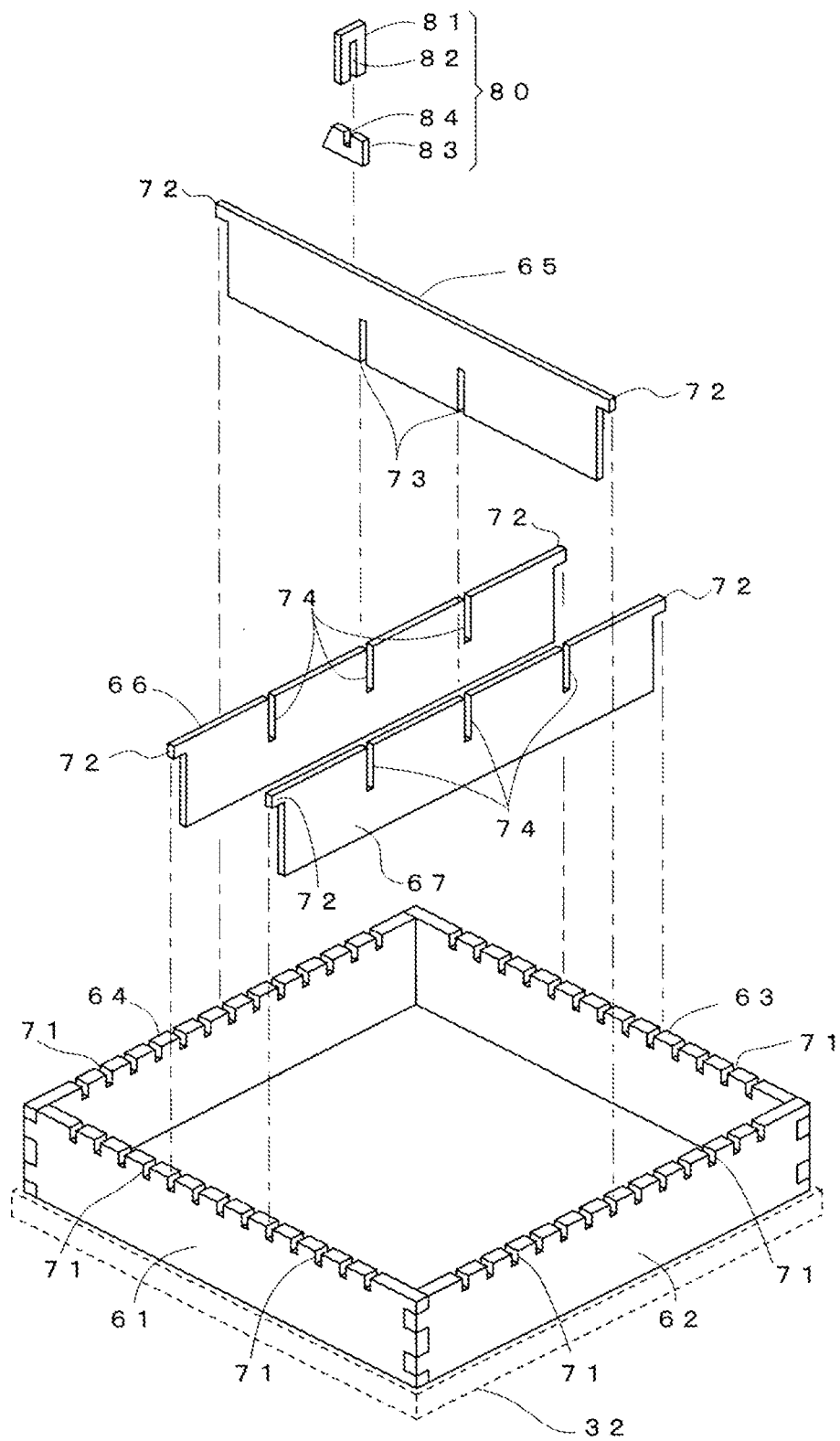
FIG. 16 is an exploded perspective view of the grid-shaped support portion.

As one means for obtaining the height, for example, it may be considered that a grid-shaped support portion 60 and terminal pressers 80 shown in FIGS. 15 and 16 are used.

The grid-shaped support portion 60 is formed in a grid form by a plurality of plates that stand up on the bottom plate 32, and supports the housing of the wireless terminal 1 on a rear surface side thereof at upper edges of the grid-shaped support portion 60. The terminal presser 80 is formed to be lockable at an unspecified position on the upper edges of the plurality of plates that form the grid-shaped support portion 60, and fixes the position of the housing of the wireless terminal 1 supported on the upper edges.

A variety of structures of the grid-shaped support portion 60 may be considered, but in this example, for example, a structure in which the grid-shaped support portion 60 is assembled in a grid form using plates 61 to 67 that are formed of a plurality of (in the figure, six) foaming materials of an approximately rectangular shape having a foaming magnification of about 20 times, a thickness of about several millimeters, and a height H' of about H−α (which is, for example, about 65 mm, but may be changed in accordance with a thickness of a wireless terminal to be supported or a height position of a terminal antenna in a housing).

In this example, a frame is formed in an approximately square shape of which one side almost becomes 400 mm that is identical to an outer appearance of the bottom plate 32 by assembling four plates 61 to 64 so that opposite ends thereof are engaged with each other, and inside the frame, one plate 65 is attached in a lateral direction, and two plates 66 and 67 are attached in a longitudinal direction to intersect the plate 65. Lower edges of four outer plates 61 to 64 assembled in the frame shape are fixed by adhesion or engagement, for example, with respect to the terminal facing surface 32a that is the upper surface of the bottom plate 32. Further, on upper edges of the plates 61 to 64, slits 71 of a predetermined depth are formed at a predetermined interval (for example, an interval of 25 mm). Further, insertion pieces 72 are provided to be inserted into the slits 71 on upper portions of the opposite ends of the plates 65 to 67 on an inner side. Further, on a lower edge of the plate 65, intersection slits 73 are provided at a distance that is two times the interval (25 mm) between the slits 71 on both sides of the center thereof, and on upper edges of the plates 66 and 67, intersection slits 74 are provided at a distance that is four times the interval (25 mm) between the slits 71 at the center thereof and on both sides of the center. Here, the widths of the slits 71 and the intersection slits are formed to be slightly narrower than the thickness of the plates 65 to 67 so that the inserted plates 65 to 67 are not to be detached. The number of the intersection slits 73 and 74 may be increased at an interval of integer times of the interval between the slits 71.

Accordingly, by selecting combined positions of the slits, it is possible to change positions of inner plates 65 to 67 in the frame as described later.

In this structure example, in order to secure an entire strength of the grid-shaped support portion, the thickness (for example, 5 mm) of four outer plates 61 to 64 are formed to be larger than the thickness (for example, 3 mm) of three inner plates 65 to 67.

Further, terminal pressers 80 are provided to be capable of being locked at unspecified positions of upper edges of the inner plates 65 to 67.

Each of the terminal pressers 80 is formed of a foaming material, and includes a substrate 81 that is formed with a slit 82 on a lower edge, and a presser plate 83 that is engaged with the substrate 81 to be orthogonal to the substrate 81 through fitting of a slit 84 provided on an upper edge thereof and the slit 82 of the substrate 81. Here, the slit 82 of the substrate 81 is engaged with each upper edge of the plates 65 to 67 in a state where there is no gap between the slit 82 of the substrate 81 and the upper edge of the plates 65 to 67, so as to press an edge portion of a housing of a wireless terminal supported on the upper edges of the plates 65 to 67 at a lower edge of the presser plate 83. Here, widths of the slits 82 and 84 are formed to be slightly narrower than thicknesses of the plates 65 to 67 so that the terminal presser 80 is not detached from the plates 65 to 67.

Figure 17A:
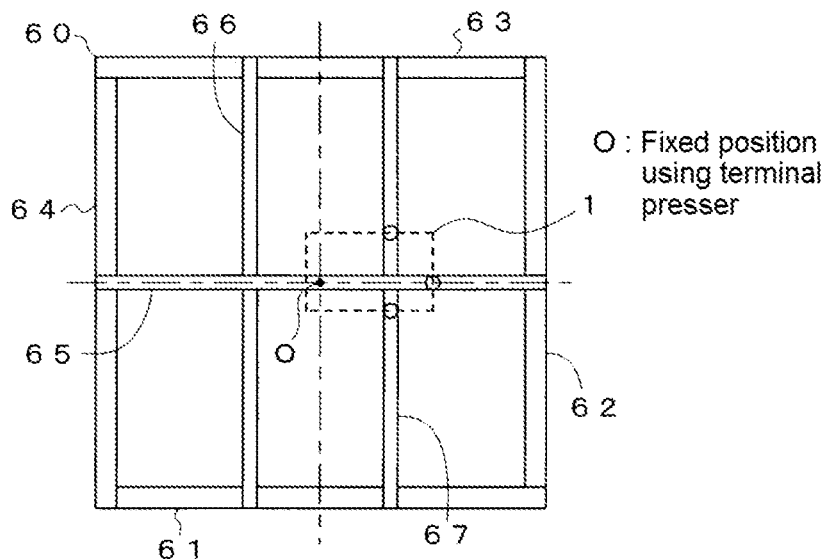
FIG. 17A to 17C are modification examples of the grid-shaped support portion.

FIG. 17 shows an example of changes of the positions of the plates 65 to 67, in which FIG. 17A shows an example in which the plate 65 is fixed to pass through the center of a frame and the plates 66 and 67 are fixed at positions that are symmetric with respect to the center of the frame. In this example, as shown in the figure, in a state where a rear surface side of a wireless terminal 1 of a small housing such as a smartphone is supported at the upper edges of the plates 65 and 67 and a terminal antenna in the vicinity of a short side of the housing of the wireless terminal 1 matches the standard point O, the terminal presser 80 is attached at positions (indicated by white circles O in the figure) where the edge portion of the housing of the wireless terminal 1 intersects the upper edges of the plates 65 and 67, and thus, it is possible to fix the position of the wireless terminal 1. At the standard point O and the position in the vicinity thereof, the terminal presser 80 is not used in consideration of an influence of the terminal presser 80.

Figure 17B:
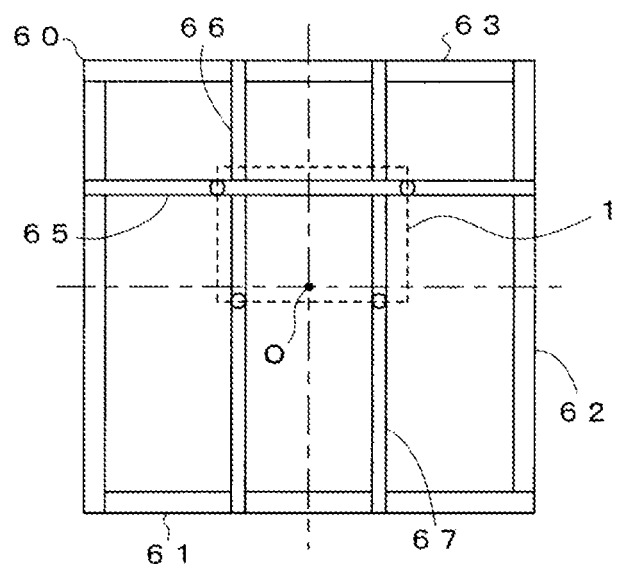

Further, FIG. 17B shows an example in which the plate 65 is fixed in a state of shifting upward (at a position close to the plate 63) from the center of the frame. In this disposition example, as shown in the figure, in a state where a rear surface side of the wireless terminal 1 of a large housing such as a tablet is supported on the upper edges of the plates 65 to 67, a terminal antenna in the vicinity of the center of a long side of the housing of the wireless terminal 1 matches the standard point O, and the terminal presser 80 is attached at positions where the edge portion of the housing of the wireless terminal 1 intersects the upper edges of the plates 65 to 67, and thus, it is possible to fix the position of the wireless terminal 1.

Figure 17C:
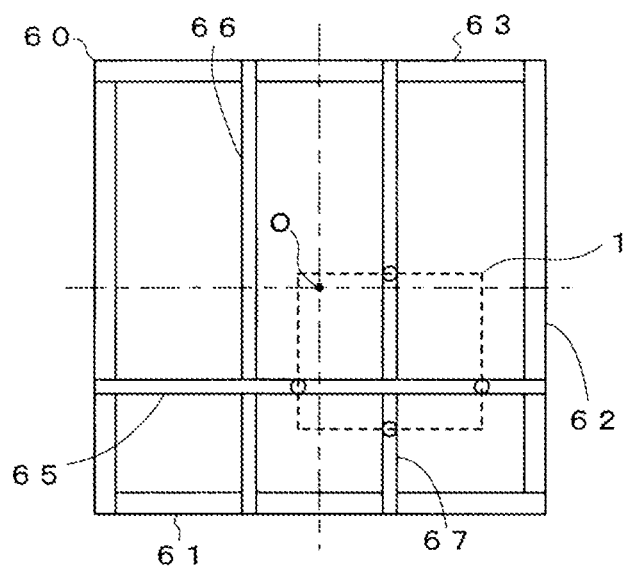

Further, FIG. 17C shows an example in which the plate 65 is fixed in a state of shifting downward (at a position close to the plate 61) from the center of the frame. In this disposition example, as shown in the figure, in a state where a rear surface side of the wireless terminal 1 of a large housing such as a tablet is supported on the upper edges of the plates 65 to 67, a terminal antenna in the vicinity of the corner portion of the housing of the wireless terminal 1 matches the standard point O, and the terminal presser 80 is attached at positions where the edge portion of the housing of the wireless terminal 1 intersects the upper edges of the plates 65 to 67, and thus, it is possible to fix the position of the wireless terminal 1.

In this way, since the grid-shaped support portion 60 is formed by a thin plate made of a foaming material that stands up on the terminal facing surface 32a, even in a case where the terminal facing surface 32a is at an angle close to the horizontal state, an incidence angle of a radio wave that is incident to the grid-shaped support portion 60 necessarily becomes small, and the grid-shaped support portion 60 transmits the radio wave at a large transmission rate. Thus, an influence of reflection due to the grid-shaped support portion 60 becomes small. Further, since it is possible to change the positions of the plates 65 to 67 in the frame of the grid-shaped support portion 60, in a state where the terminal antenna is disposed at the reference position O, it is possible to variously change the positions where the upper edges of the inner plates 65 to 67 and the edge portion of the housing of the wireless terminal 1 intersect each other. Further, it is possible to position the wireless terminal 1 at an appropriate position, in accordance with a difference between antenna positions based on outer appearances of the wireless terminals.

The structures of the grid-shaped support portion 60 and the terminal presser 80 are merely examples. The grid-shaped support portion 60 may employ any structure in which the grid-shaped support portion 60 is formed in a grid form by a plurality of plates that stand up on the bottom plate 32 and the housing of the wireless terminal 1 is supported on upper edges of the plates on a rear surface side thereof. For example, the above-mentioned structure is a structure in which a rectangular outer frame is provided to secure strength and one plate and two plates intersect each other therein to provide support, but a grid-shaped support portion in which an outer frame is not provided and two plates and two plates intersect each other in a matrix form may be used. Further, the terminal presser 80 may employ any structure in which an edge portion of a housing of a wireless terminal can be pressed on the upper edges of the plates 65 to 67 that form the grid-shaped support portion 60 in a state of being locked at unspecified positions of the upper edges of the plates 65 to 67.

DESCRIPTION OF REFERENCE NUMERALS AND SIGNS

1: wireless terminal
20: wireless terminal measurement apparatus
21: radio wave anechoic box
22: radio wave absorbent
30: terminal holding rotation mechanism
31: terminal holding section
32: bottom plate
32a: terminal facing surface
32b: hole
33, 34: side plate
35: rotation mechanism
36: motor
37: base
38, 39: support arm
40, 41: pulley
43, 44: belt
45: shaft
50: measurement section
51: rotation controller
52: characteristic acquisition section
60: terminal support portion
61 to 67: plate
71, 73, 74: slit
72: insertion piece
80: terminal presser
81: substrate
82, 84: slit
83: presser plate

What is claimed is:

1. A wireless terminal measurement apparatus comprising:
 a measurement antenna which is fixed at a predetermined position in a measurement space in which entrance of a radio wave from the outside and internal reflection of the radio wave are suppressed; and a terminal holding rotation mechanism that includes a terminal holding section that holds, using a position that is spaced away from the measurement antenna by a predetermined distance as a standard point in the measurement space, a wireless terminal that is a measurement target on one surface side of a bottom plate of a predetermined area in a state where a terminal antenna of the wireless terminal is positioned at the standard point, and a rotation mechanism that rotates the terminal holding section around the standard point, wherein a characteristic of the wireless terminal is obtained by the wireless terminal measurement apparatus performing transmission and reception of a radio wave between the measurement antenna and the wireless terminal while changing a posture of the wireless terminal with respect to the measurement antenna, and wherein a distance from the standard point to the one surface of the bottom plate of the terminal holding section is set so that a reflectivity of a reflection wave that is output from one of the measurement antenna and the wireless terminal, is reflected from the one surface of the bottom plate of the terminal holding section, and is input to the other one thereof is equal to or smaller than a value of a predetermined allowable limit.

2. The wireless terminal measurement apparatus according to claim 1, wherein the value of the predetermined allowable limit of the reflectivity is given to be equal to or smaller than a predetermined incidence angle in view of a characteristic of incidence angle-to-reflectivity determined by a specific dielectric constant of the terminal holding section.

3. The wireless terminal measurement apparatus according to claim 2, wherein the terminal holding section is formed of a foaming material of a specific dielectric constant of 1.03, and has an incidence angle for assigning the allowable limit of 80°.

4. The wireless terminal measurement apparatus according to claim 2, wherein the terminal holding section is formed of a foaming material of a specific dielectric constant of 1.03, and has an incidence angle for assigning the allowable limit of 70°.

5. The wireless terminal measurement apparatus according to claim 1, wherein the terminal holding section is provided with a support portion that stands up on the bottom plate.

6. The wireless terminal measurement apparatus according to claim 5, wherein the support portion is formed with a plurality of plates in a grid form, and supports a housing of the wireless terminal on upper edges of the plurality of plates, and wherein the terminal holding section is further provided with a terminal presser that is formed to be engaged with an unspecified position of the upper edges of the plurality of plates that form the support portion and fixes a position of the housing of the wireless terminal supported on the upper edges of the plurality of plates of the support portion.

7. The wireless terminal measurement apparatus according to claim 2, wherein the terminal holding section is provided with a support portion that stands up on the bottom plate.

8. The wireless terminal measurement apparatus according to claim 3, wherein the terminal holding section is provided with a support portion that stands up on the bottom plate.

9. The wireless terminal measurement apparatus according to claim 4, wherein the terminal holding section is provided with a support portion that stands up on the bottom plate.

10. The wireless terminal measurement apparatus according to claim 7, wherein the support portion is formed with a plurality of plates in a grid form, and supports a housing of the wireless terminal on upper edges of the plurality of plates, and wherein the terminal holding section is further provided with a terminal presser that is formed to be engaged with an unspecified position of the upper edges of the plurality of plates that form the support portion and fixes a position of the housing of the wireless terminal supported on the upper edges of the plurality of plates of the support portion.

11. The wireless terminal measurement apparatus according to claim 8, wherein the support portion is formed with a plurality of plates in a grid form, and supports a housing of the wireless terminal on upper edges of the plurality of plates, and wherein the terminal holding section is further provided with a terminal presser that is formed to be engaged with an unspecified position of the upper edges of the plurality of plates that form the support portion and fixes a position of the housing of the wireless terminal supported on the upper edges of the plurality of plates of the support portion.

12. The wireless terminal measurement apparatus according to claim 9, wherein the support portion is formed with a plurality of plates in a grid form, and supports a housing of the wireless terminal on upper edges of the plurality of plates, and wherein the terminal holding section is further provided with a terminal presser that is formed to be engaged with an unspecified position of the upper edges of the plurality of plates that form the support portion and fixes a position of the housing of the wireless terminal supported on the upper edges of the plurality of plates of the support portion.

\* \* \* \* \*